United States Patent [19]

Berrigan et al.

[11] Patent Number: 4,931,721

[45] Date of Patent: Jun. 5, 1990

[54] DEVICE FOR AUTOMATICALLY ASCERTAINING CAPACITANCE, DISSIPATION FACTOR AND INSULATION RESISTANCE OF A PLURALITY OF CAPACITORS

[75] Inventors: Paul J. Berrigan, Circleville, Ohio; Michael J. Brennan, Jr., Wilmington, Del.

[73] Assignee: E. I. du Pont de Nemours and Company, Wilmington, Del.

[21] Appl. No.: 288,495

[22] Filed: Dec. 22, 1988

[51] Int. Cl.$^5$ .................... G01R 27/26; G01R 31/02
[52] U.S. Cl. .................................... 324/658; 324/548
[58] Field of Search ............... 324/60 C, 60 R, 57 R, 324/548, 73 R, 158 F; 209/574

[56] References Cited

U.S. PATENT DOCUMENTS

| | | | |
|---|---|---|---|
| 2,925,553 | 2/1960 | Shillington | 324/548 |
| 3,042,860 | 7/1962 | Shillington | 324/548 X |
| 3,281,675 | 10/1966 | Shillington | 324/548 |
| 3,465,403 | 9/1969 | Brown | 29/25.42 |
| 3,496,464 | 2/1970 | Tankersley | 324/73 R |
| 3,508,146 | 4/1970 | Jackson | 324/60 |
| 3,518,537 | 6/1970 | McFee | 324/60 |
| 3,530,379 | 9/1970 | Demerliac | 324/60 |
| 3,652,929 | 3/1972 | Cushman | 324/51 |
| 3,840,809 | 10/1974 | Yun | 324/158 D |
| 4,218,649 | 8/1980 | Kutzavitch | 324/54 |
| 4,337,561 | 7/1982 | Zaengl et al. | 323/208 |
| 4,345,204 | 8/1982 | Shelley | 324/61 R |
| 4,404,517 | 9/1983 | Machida | 324/57 R |
| 4,481,464 | 11/1984 | Noguchi et al. | 324/57 |
| 4,509,012 | 4/1985 | Lin | 324/158 |

OTHER PUBLICATIONS

Shatzkes et al., "Statistics of Breakdown", IBM Journal of Research and Development, vol. 25, May 1981, pp. 167–175.
Maeda et al., "Multi-Frequency LCR Meters Test Components Under Realistic Conditions", Hewlett-Packard Journal, vol. 30, No. 2, pp. 24–31, Feb. 1979.
Hashimoto et al., "An Automatic Wide-Range Digital LCR Meter", Hewlett-Packard Journal, vol. 28, No. 1, pp. 9–15, Sep. 1976.
Maeda, K., "An Automatic, Precision 1-Mhz Digital LCR Meter", Hewlett-Packard Journal, vol. 25, No. 7, pp. 2–9, Mar. 1974.

Primary Examiner—Reinhard J. Eisenzopf
Assistant Examiner—Jack B. Harvey

[57] ABSTRACT

Apparatus for automatically measuring and recording, in a seqential manner, various parameters such as capacitance, dissipation factor and insulation resistance, of each of a plurality of capacitors under substantially identical test conditions. The apparatus discharges residual charge on each capacitor.

20 Claims, 4 Drawing Sheets

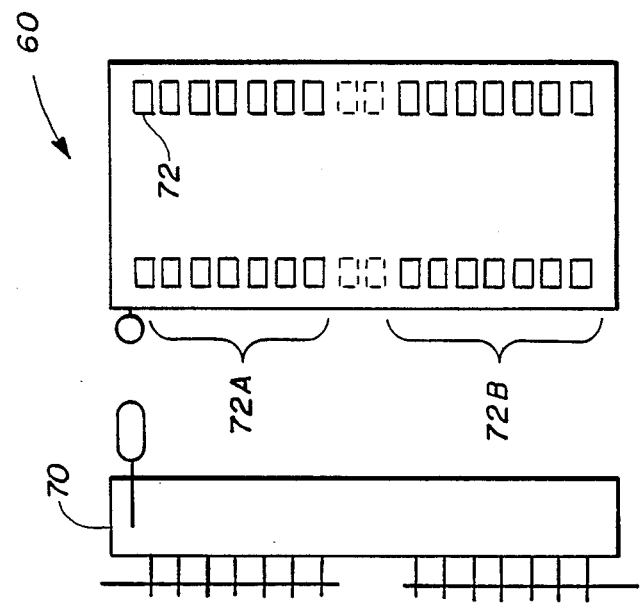
Fig. 3A
Fig. 3B
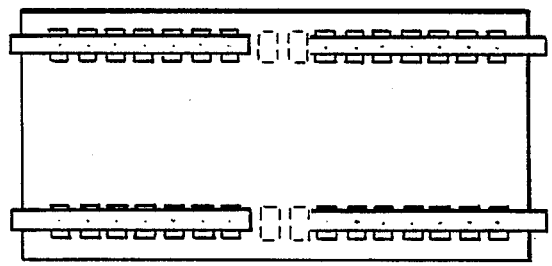
Fig. 3C

DEVICE FOR AUTOMATICALLY ASCERTAINING CAPACITANCE, DISSIPATION FACTOR AND INSULATION RESISTANCE OF A PLURALITY OF CAPACITORS

BACKGROUND OF THE INVENTION

1. Field of the Invention

The present invention relates to automated test equipment for the testing of capacitors.

2. Description of the Prior Art

Capacitors manufactured using a film dielectric are typically characterized by the same electrical parameters as are ceramic or electrolytic capacitors. Representative of such parameters used to characterize film dielectric capacitors are capacitance, insulation resistance (i.e., leakage current), and dissipation factor. These are the parameters typically tested in order to insure that the manufacturing process produces devices that meet acceptable specified limits.

Individual pieces of test equipment are available for testing each of these various parameters. However, in order to obtain statistically significant results a large number of capacitors should be tested. Testing capacitors according to present industry practice is a time-consuming and labor intensive process. To effect such testing each capacitor is presently individually connected in turn to each piece of test apparatus and the appropriate test run on that apparatus. Since the testing of all of the capacitors should be effected under substantially identical test conditions, such as temperature and humidity, it is difficult to guarantee that such will be the case when a large number of capacitors are individually tested. Accordingly, it is believed advantageous to provide an apparatus which will automatically test each of a plurality of capacitor samples for each of a predetermined number of parameters under substantially identical test conditions.

SUMMARY OF THE INVENTION

The present invention relates to an apparatus for automatically measuring characteristics, such as capacitance, dissipation factor and insulation resistance, of each one of a plurality of capacitors. The apparatus includes a predetermined number of test fixtures, each test fixture being adapted to receive one of the capacitors to be tested, and a plurality of measurement devices for measuring various parameters. A relay matrix, having a plurality of relays therein, is connected such that each test fixture may be connected to one of the measurement devices and to a high voltage source of electrical potential. Also included in the test apparatus is means for energizing predetermined ones of the relays in accordance with a predetermined sequence thereby to connect the capacitor associated with each relay to the desired measurement device. Control means is provided for asserting the measurement devices and for controlling the output of the voltage source to apply a predetermined high voltage to each capacitor connected to the source by the energization of a relay.

The apparatus further includes recording means associated with the measurement devices for recording the measured values of the capacitor. In the preferred instance the energizing means, the control means, and the recording means are implemented using a digital computer operating in accordance with a program.

Each test fixture is configured from a socket having a body with a first and a second group of receptacles disposed in the body. Each group contains at least one receptacle. A first lead on each capacitor being tested is receivable by a receptacle in the first group of receptacles and a second lead on the capacitor is receivable by a receptacle in the second group. The first receptacle is connected to a first contact set and the second receptacle is connected to a second contact set of the relay associated with the test fixture.

BRIEF DESCRIPTION OF THE DRAWINGS

The invention will be more fully understood from the following detailed description thereof, taken in connection with the accompanying drawings, which form a part of this application and in which:

FIGS. 3A, 3B and 3C are, respectively, a plan, side elevational and bottom views of the physical structure of a capacitor test socket assembly for use in the capacitor testing apparatus of the present invention.

Figure 1:
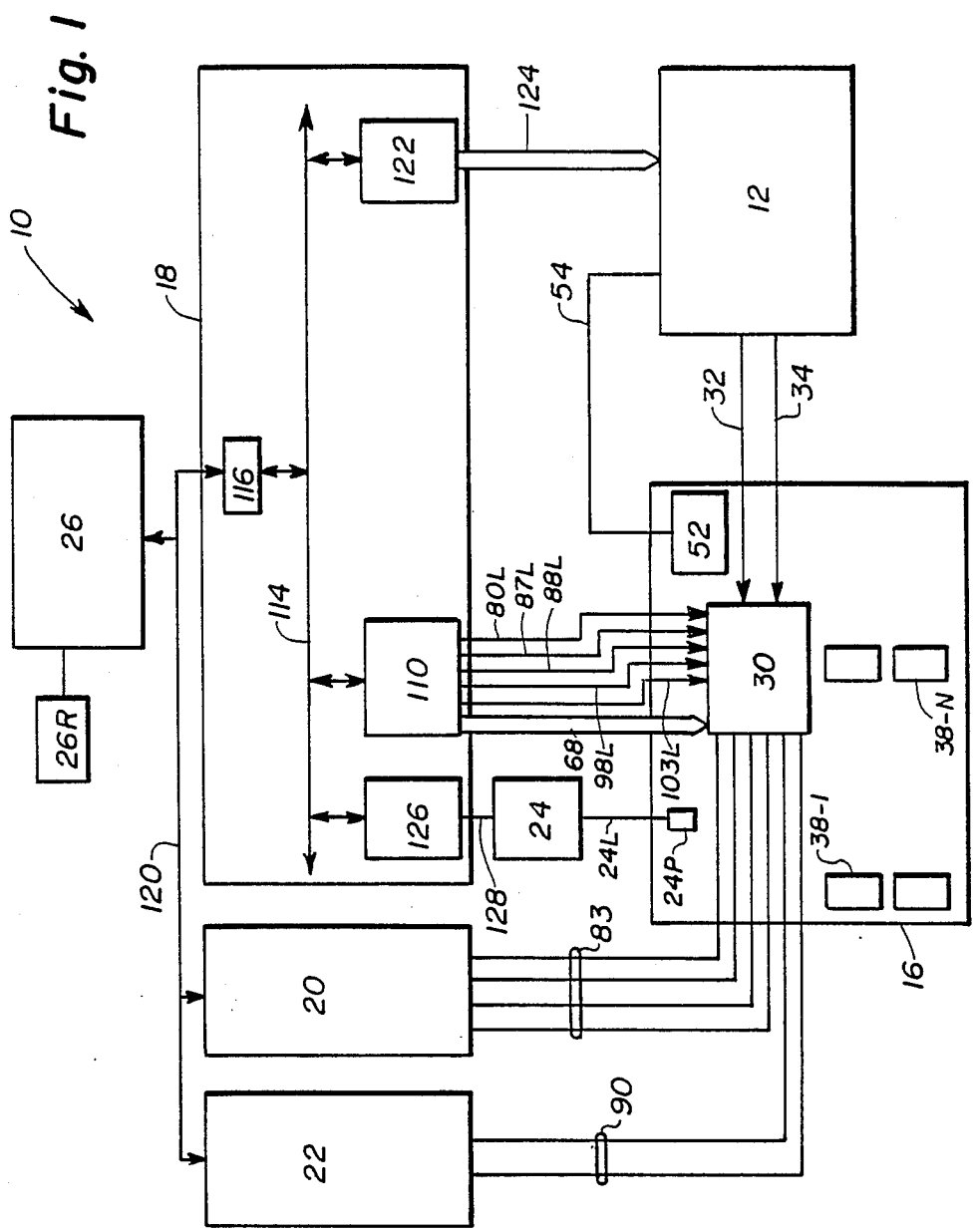
FIG. 1 is a system block diagram of the automatic capacitor testing apparatus in accordance with the present invention.

An Appendix containing a listing of a computer program in HP BASIC 2.1 language is appended to this application following the specification preceding the claims. The Appendix forms part of this application.

DETAILED DESCRIPTION OF THE INVENTION

Throughout the following detailed description similar reference characters refer to similar elements in all figures of the drawings.

With reference to FIG. 1 shown is a system block diagram of an automatic capacitor testing apparatus in accordance with the present invention for automatically measuring various predetermined parameters of each of a plurality of capacitors. The testing apparatus is generally indicated by reference character 10. The parameters able to be tested include capacitance, insulation resistance (i.e., leakage current), and dissipation factor.

The testing apparatus 10 includes a controllable high voltage source 12 of electrical potential, an N position capacitor holding assembly 16, an interface 18, a combination inductance, capacitance and resistance (LCR) measurement device 20, a picoampere current measurement device 22, temperature measuring device 24 and a programmable controller 26. The interface 18 is implemented using a card cage such as that manufactured by Hewlett Packard Inc., Palo Alto, Calif. and sold as the model number HP 6942A multiprogrammer interface. Suitable for use as the controller 26 is the device manufactured by Hewlett Packard Inc., Palo Alto, Calif. and sold under model number HP 9826. The combination inductance, capacitance and resistance (LCR) device 20 is preferably implemented using a Hewlett Packard HP 4274A instrument. The picoampere current measuring device 22 is preferably a Hewlett Packard HP 4140B instrument. The temperature measuring device 24 is preferably implemented using a device manufactured by John Fluke Manufacturing Co, Everett, Wash. and sold under model number 2170A. If desired the assembly 16 may be thermally insulated and/or temperature controlled to insure a particular predetermined temperature under which the capacitors are to be tested.

The source 12 is connected by a high voltage input line 32 and a high voltage ground line 34 to the capacitor holding assembly 16. The lines 32 and 34 are implemented as a coaxial cable. The use of a coaxial cable throughout the apparatus 10 is preferred to insure immunity to electrical noise. Suitable for use as the source 12 is a high voltage power supply such as that manufactured and sold by Bertan Company of Syosset, N.Y. and sold as model number 205A-01R. The assembly 16 contains an interconnection network generally indicated by reference numeral 30 and a predetermined number N of test fixtures 38-1 through 38-N. As used herein, high voltage is meant to denote dc voltages up to one thousand (1000) volts. Disposed in the holding assembly 16 in temperature sensing proximity to the fixtures 38 is a temperature probe 24P connected to the temperature measuring instrument 24 over a line 24L. In the preferred implementation the probe 24P and the line 24L are provided as a part of the instrument 24, but it should be appreciated that a separate probe or probes may be used to measure the temperature of the fixtures and to provide a signal representing the same to the instrument 25 over a suitable interconnection line(s).

Figure 2:
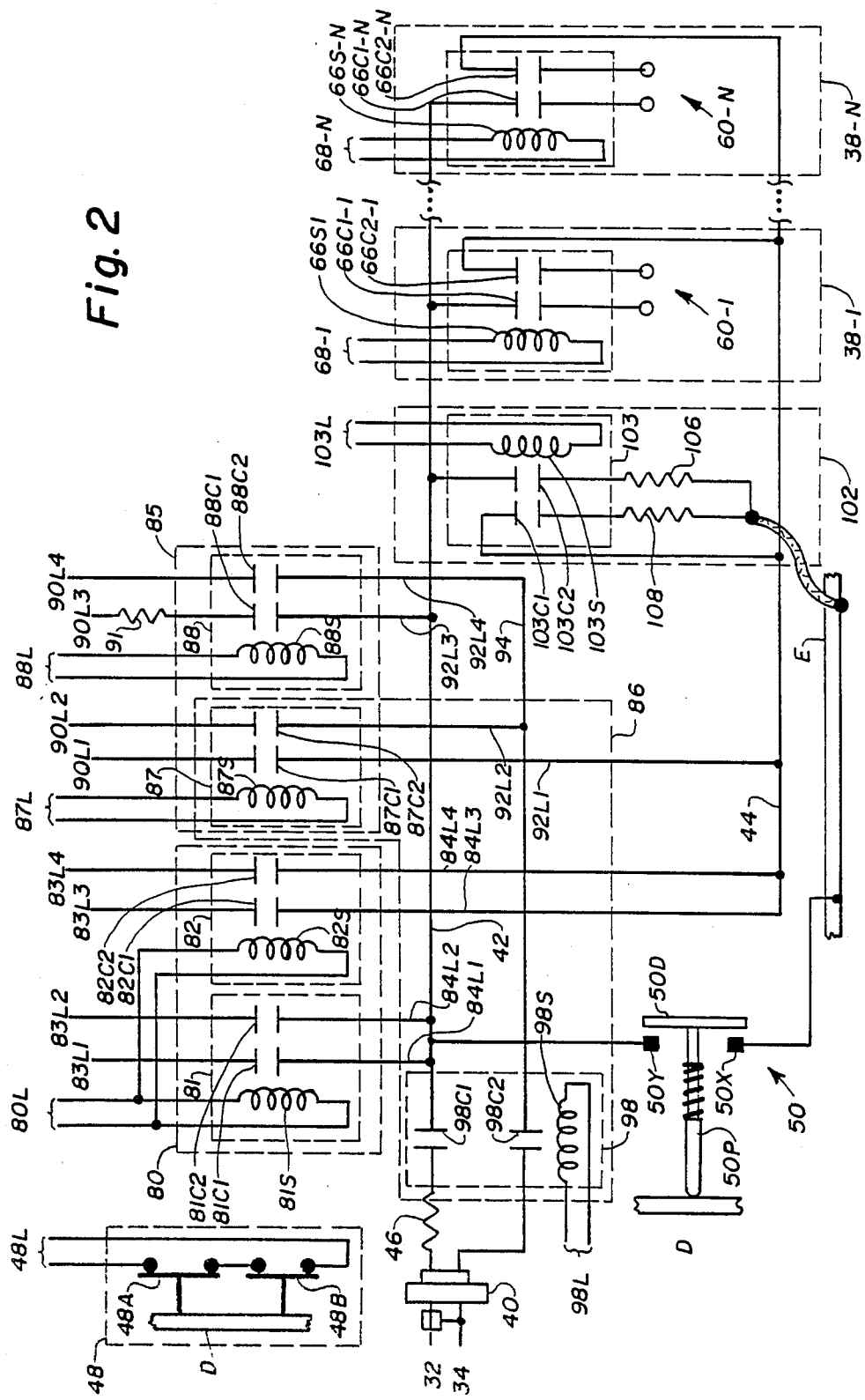
FIG. 2 is a schematic diagram of the interconnection circuitry in the capacitor holding assembly used in the capacitor testing apparatus of the present invention.

As may be understood from FIG. 2, the lines 32 and 34 are connected by a coaxial jack 40, through a relay 98, to a high rail 42 and a common potential point 94. A high resistance (on the order of fifty thousand ohms) and high wattage (on the order of twenty five watts) resistor 46 is connected in series between jack 40 and the high rail 42 to protect the power supply 12. A door interlock switch 48 and a door actuated rail shorting switch 50 are both physically mounted within a metal enclosure provided for the capacitor holding assembly 16. A portion of the enclosure is diagrammatically indicated by the reference character E. The enclosure E is provided with an access door diagrammatically indicated by the reference character D. The enclosure E having the door D therein may be formed by any suitable construction well within the skill of the art or any commercially available electrical box may be used. The interlock switch 48 is implemented using a pair of microswitches 48A, 48B, from which emanate a pair of lines 48L. The lines 48L are connected to a distribution board 52 (see FIG. 1). The output 54 from the board 52 is connected to the enable terminal of the supply 12. Suitable for use as the microswitches 48 are devices manufactured by Omron Corp., of Schaumburg, Ill. and sold as model number S-5HL12-IAS-K. The rail shorting switch 50 is formed by a pair of contacts 50X, 50Y that are bridged by a contact disc 50D. The disc 50D is connected to a spring loaded plunger 50P that physically engages the door D of the enclosure E. When the door D is closed the plunger 50P causes the disc 50D to disengage from the contacts 50X, 50Y. When the door D is opened switches 48 open, thereby disabling the high voltage supply 12 via the board 52 and the line 54 therefrom. Also, upon further opening of the door D the disc 50D engages the contacts 50X, 50Y and shorts the high rail 42 to chassis ground on enclosure E to prevent an electrical shock hazard to the operator. FIG. 2 depicts the disc 50D in the position it occupies relative to the contacts 50X, 50Y when the door D is closed.

As is seen in FIG. 2 each test fixture 38 is connected between the high rail 42 and the low rail 44. Each test fixture 38 is adapted to receive one of the capacitors to be tested. Each fixture 38 includes a socket assembly, generally indicated by reference character 60, and a relay 66. Each relay 66 includes two pairs of contacts 66C1 and 66C2 and an actuating coil 66S. The coil 66S of each relay 66 is connected over lines 68 extending to the interface 18 as will be described. Suitable for use as the relays 66 are those high insulation resistance, flying lead relays manufactured by Douglas Randall Company of Pawcatuck, Conn. as model number 379525.

As seen in FIGS. 3A through 3C the socket assembly 60 physically comprises a body portion 70 formed of an insulating material such as polyamide-imide, manufactured by Amoco Chemical Co. under the trademark Torlon. The body portion 70 has a predetermined number of receptacles 72 arranged therein. In the preferred instance the receptacles 72 are arranged in two groupings indicated by the reference characters 72A and 72B.

In the preferred case the socket assembly 60 is implemented using a zero insertion force, dual in line planar device such as that manufactured and sold by Textool Incorporated, Irving, Tex., under model number 240-3346-00-2402. The assembly contains dual rows of adjacent receptacles, and thus may be used to define a pair of socket assemblies. The assembly is modified by removing several of the receptacles and associated pins and wiring together the remaining pins to define the receptacle groupings discussed above. This increases the electrical isolation of the receptacles in each grouping. The openings from which the receptacles have been removed are filled with a nonconducting polymeric material such as epoxy.

The interconnection network 30 includes a dedicated relay arrangement adapted to interconnect each of the test devices to the high and low rails 42 and 44, respectively. In general, in the preferred embodiment illustrated the network 30 includes a first relay arrangement 80 that interconnects the LCR instrument 20 to the rails 42 and 44 and a second relay arrangement 85 that interconnects both the measurement and the voltage source terminals of the picoampere instrument 22 to the rails 42 and 44 and a third relay arrangement 86 that interconnects only the measurement terminals of the picoampere instrument 22 and the separate external high voltage source 12 to the rails 42 and 44.

In the preferred embodiment illustrated in FIG. 2 the first relay arrangement 80 is implemented using a pair of double pole, normally open relays 81, 82, each identical to the relay 66. The relay 81 includes a dual contact set 81C1, 81C2 and an actuating coil 81S while the relay 82 includes a dual contact set 82C1, 82C2 and an actuating coil 82S. The pair of relays 81, 82 is required to implement the first relay arrangement 80 since the particular measuring instrument (the LCR instrument 20) has four measuring terminals. One side of the contacts of the relays 81, 82 of the first relay arrangement 80 is connected to the instrument 20 over a group 83 of four lines 83L-1, 83L-2, 83L-3 and 83L-4. Each of the lines 83L-1, 83L-2, 83L-3 and 83L-4 is preferably implemented using a coaxial cable. The other side of the contacts 81C1 and 81C2 of the relay 81 is connected to the high rail 42 over lines 84L-1 and 84L-2. The other side of the contacts 82C1 and 82C2 of the relay 82 is connected to the low rail 44 over lines 84L-3 and 84L-4. The coils of the relays 81, 82 are wired in parallel and connect to the interface 18 over a pair of control lines 80L.

The second and third relay arrangements 85 and 86 are each implemented using a pair of double pole, normally open relays 87, 88, and 87, 98, respectively, each identical to the relay 81. The relay 87 includes a dual contact set 87C1, 87C2 and an actuating coil 87S while the relay 88 includes a dual contact set 88C1, 88C2 and an actuating coil 88S. The pair of relays 87, 88 is required to implement the second relay arrangement 85 since the particular measuring instrument (the picoampere measuring instrument 22), when using its internal voltage source, has four required connections, two measurement terminals and two voltage terminals. One side of the contacts of the relays 87, 88 of the second relay arrangement 85 is connected to the instrument 22 over a group 90 of four lines 90L1, 90L2, 90L3 and 90L4. The lines 90L1 and 90L2 are preferably implemented as the two inner conductors of a triaxial cable. The lines 90L3 and 90L4 are preferably implemented as the center conductor and the shield of a coaxial cable. A high resistance (on the order of fifty thousand ohms) and high wattage (on the order of twenty five watts) resistor 91 is connected in series between line 90L3 and the high rail 42 to protect the internal voltage source of picoampere instrument 22. The other side of the contact 87C1 of the relay 87 is connected to the low rail 44 over a line 92L1. The other side of the contact 88C1 of the relay 88 is connected to the high rail 42 over a line 92L3. The other side of the contacts 87C2 and 88C2 of the relays 87, 88 are connected to a point of common potential 94. The coils of the relays 87, 88 each connect to the interface 18 over pairs of control lines 87L, 88L.

The third relay arrangement 86 is comprised of the pair of relays 87, 98 (each identical to the relay 81). The relay 98 includes a dual contact set 98C1, 98C2 and an actuating coil 98S. The pair of relays 87, 98 is required to implement the third relay arrangement 86 since the particular measuring instrument (the picoampere measuring instrument 22), when used with a separate external voltage source, has two required connections (the two measurement terminals) and the separate external voltage source has two required connections. The coil 98S of the relay 98 is connected to the interface 18 over a pair of control lines 98L. One side of the contact 98C1 is connected to the high rail 42. The other side of the contact 98C1 is connected to the supply 12 over the line 32. The first side of the contact 98C2 is connected to the point of common potential 94. The second side of the contact 98C2 is connected to the supply 12 over the line 34.

The interconnection network 30 further includes a discharge relay arrangement 102 comprising a relay 103 identical to the relay 81. The relay 103 includes a dual contact set 103C1, 103C2 and an actuating coil 103S. The coil 103S of the relay 103 is connected to the interface 18 over a pair of control lines 103L. One side of the contact 103C1 is connected to the high rail 42. The other side of the contact 103C1 is connected in series with a high resistance (on the order of fifty thousand ohms) and high wattage (on the order of twenty five watts) resistor 106 to chassis ground of enclosure E. One side of the contact 103C2 is connected to the low rail 44. The other side of the contact 103C2 is connected in series with another high resistance (on the order of fifty thousand ohms) and high wattage (on the order of twenty five watts) resistor 108 to chassis ground of enclosure E. The discharge relay arrangement 102 provides means to dissipate stored energy remaining across a capacitor in the test fixture and thus provides capacitor discharge means connected across the fixtures for discharging a capacitor previously connected to either the internal high voltage source of the picoampere instrument 22 or the separate external high voltage source 12.

The interconnection arrangement above described for interconnecting the particular test instrument to the holding assembly 16 is necessary to permit accurate measurement by the instrument of the desired parameter. The shielding of the cables, the interconnection of their shields to a common potential, and the very high insulation resistance (on the order of hundreds of thousands of megohms) of the relays used allows an accurate measurement to be made. The key point to note is that even though the capacitor being tested is physically remote from the instrument, in accordance with the present invention it appears as if it is electrically proximal to the instrument.

The relays in the capacitor holding assembly 16 together with the relays in the interconnection network 30 cooperate to form a relay matrix connected between the test fixtures 38 and the plurality of measurement devices 20, 22 (and, when used in conjunction with the test instrument 22, as will be developed, the high voltage supply 12).

Mounted in the interface 18 is a relay output control arrangement generally indicated by reference character 110. The relay output control 110 includes, in the preferred case, one or more output modules such as those manufactured by Hewlett Packard Inc., Palo Alto, Calif. and sold under model number 69730A. The relay control 110 is connected to the relay control lines 68 emanating from the coils of each of the relays 66 respectively disposed in each of the test fixtures 38 and to the relay control lines 80L, 87L, 88L, 98L and 103L. The relay output control 110 is connected to an internal bus 114. The bus 114 is connected through an interface 116 and over a communications bus 120 to the programmable controller 26. The communications bus 120 may be implemented in accordance with IEEE Standard 488. The controller 26 and the relay output control 110 act together to assert the coil 66S associated with a given one of the relays 66 by sending an enabling signal over the control lines 68 associated with the predetermined relay 66. The controller 26 and the relay output control 110 also act together to assert one or more of the paired coils 81S, 82S, the coils 87S and 88S, and the coils 87S and 98S respectively associated with a given one or more of their associated relays by sending an enabling signal over the appropriate respective control lines 80L, 87L, 88L and 98L. Thus, the controller 26 and the relay output control 110 together define means for energizing predetermined combinations of the relays in the relay matrix in accordance with a predetermined sequence thereby to connect a capacitor mounted in predetermined ones of the text fixtures with predetermined ones of the measurement devices. The controller 26 and the relay output control 110 additionally act together to assert the coil 103S associated with the discharge relay 103 by sending an enabling signal over the appropriate control line 103L.

Also mounted in the interface 18 is a digital output module 122. Preferred for use as the digital output module 122 is the device manufactured by Hewlett Packard Inc., Palo Alto, Calif. and sold under model number 69731A. The output of the module 122 is applied to the high voltage supply 12 over the lines 124. The digital output module 122 is connected to the internal bus 114 and, thus, to the programmable controller 26. In a manner to be described the controller 26 together with the digital output module 122 to define control means for controlling the output of the voltage source 12 to apply a predetermined high voltage.

Also mounted in the interface 18 is a digital input module 126. Preferred for use as the digital input module 126 is the device manufactured by Hewlett Packard and sold under model number 69771A. The input of the module 126 is connected to the temperature measuring instrument 24 over the lines 128. The module 126 is connected to the internal bus 114 and thus to the programmable controller 26. The probe 24P provides means for generating a signal representative of the temperature on the interior of the capacitor holding assembly 16 and, thus, of a capacitor in a test fixture while the the instrument 24, the module 126 and the controller 26 cooperate to define means for recording the temperature. In the embodiment described the value of the temperature is stored in the memory of the controller 26. Of course, any suitable recording device indicated diagrammatically at 26R could be used in conjunction with the controller 26. As an example, the device 26R may take the form of a magnetic media recording device, a hardcopy printer, a plotter and/or a CRT display.

The instruments 20 and 22 are interconnected to the controller 26 over the communications bus 120.

The operation of the apparatus heretofore set forth will be explained in the context of testing multiple capacitors for various parameters, including, for example, capacitance, dissipation factor and insulation resistance. With reference to the block diagram of the program shown in FIG. 4, at 150 the operator initializes the apparatus 10 by energizing the hardware and loading the program defining the test protocol into the controller 26.

The operator then loads the capacitors to be tested into the appropriate test fixtures 38-1 through 38-N. Not all of the fixtures need be used. The individual capacitors are loaded with one lead of the capacitor inserted into a receptacle in the receptacle group 72A and other lead into a receptacle in receptacle group 72B. The appropriate receptacle in the particular receptacle group is selected based upon the physical size of the capacitor. Once the capacitors are locked in place, the door D of the enclosure surrounding the holding assembly 16 is closed, thus closing the interlock switch 48 and opening the rail shorting switch 50, thereby allowing a voltage to appear across the high rail 42 and the low rail 44.

As also shown at 152, the operator provides sample identification and test details. Examples of the former include sample description, capacitor type (metallized film, film/foil, electrolytic, multilayer ceramic, etc.), film thickness, and testing date. Test detail information includes operator name, job number, starting sample number, total number of samples, and the number of voltages and the specific voltage levels at which insulation resistance is to be measured.

In summary, upon the operator's command, the automatic test sequence begins. The test protocol sequentially discharges all the capacitors to be tested, measures the temperature of the capacitor holding assembly 16, selects a test instrument to be used to make one or more measurements of selected parameters on each capacitor. The capacitors to be tested are then connected sequentially to the selected test instrument, the parameters measured and recorded by the controller. The controller again sequentially discharges all the capacitors. The next test instrument is selected and the capacitors are again connected sequentially, the parameter(s) measured and recorded. This sequence is repeated until all parameters of all capacitors have been recorded. The temperature of the capacitor holding assembly 16 is measured a second time to insure that the temperature has not changed substantially since the testing began. After all parameters have been measured the controller again sequentially discharges all the capacitors. In this way it may be seen that the apparatus in accordance with the present invention automatically tests each of a plurality of capacitor samples for each of a predetermined number of parameters under substantially identical test conditions.

Figure 4:
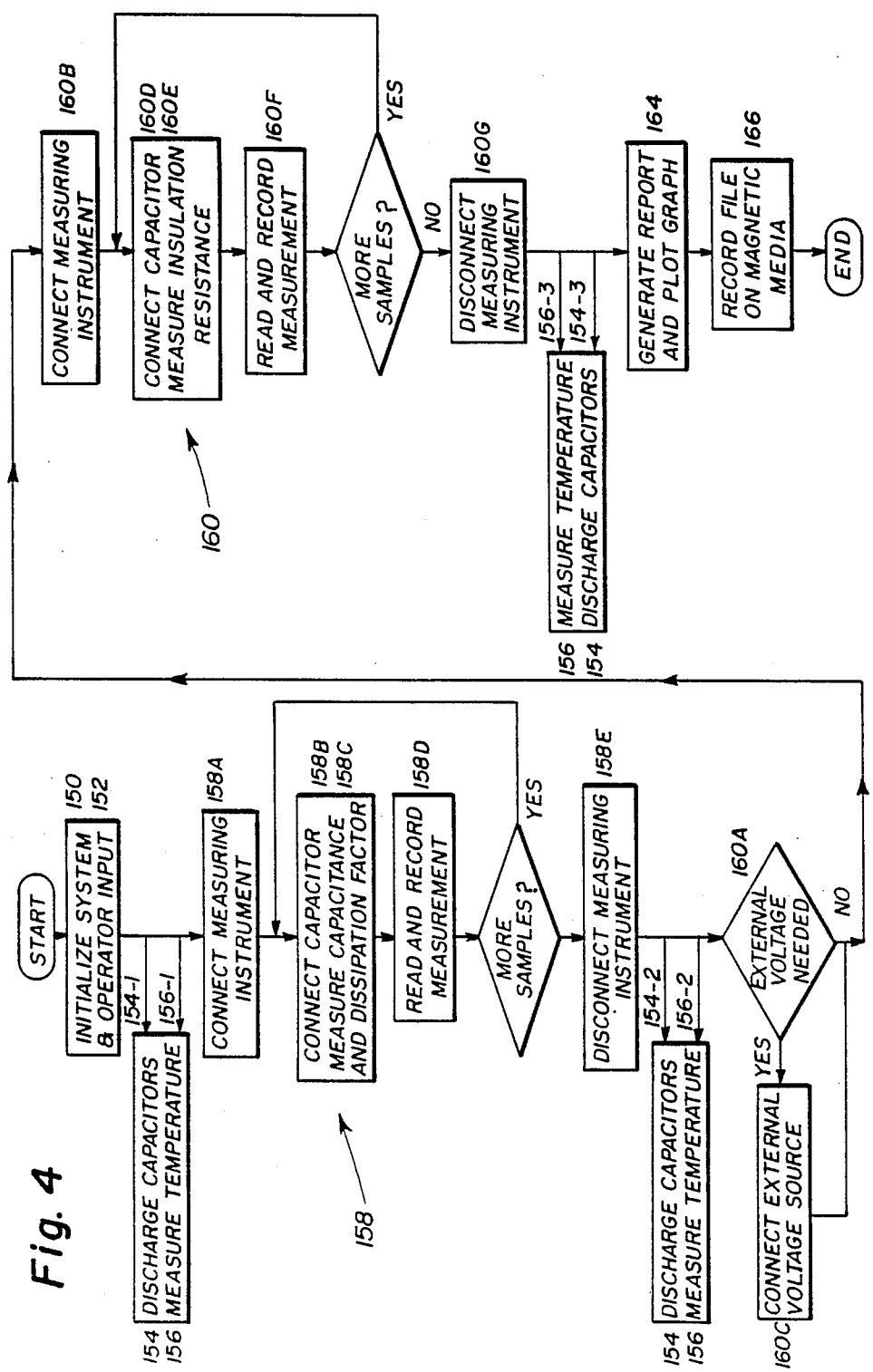
FIG. 4 is a flow diagram of the operation of the automatic capacitor testing apparatus in accordance with the present invention.

As seen at 154 in FIG. 4 the discharge relay 103 is asserted under program control to dissipate any residual charge on the capacitor. The coil 103S of the discharge relay 103 is asserted over the line 103L by the control module 110 in response to the controller 26. After a predetermined delay (typically six seconds), to dissipate any remaining charge on the capacitor, the relay 103 is opened. Calls to the routine 154 are made throughout the program listing and are indicated therein by the dashed suffix following the reference character 154.

As also seen at 156 the overall temperature of the capacitor holding assembly 16 is measured by causing the digital input module 126 to read the output of the digital temperature measuring device 24. Calls to the routine 156 are made throughout the program listing and are indicated therein in the manner similar to that discussed above.

In general once the temperature has been measured the controller 26, under program control, selects a predetermined one of the measurement instruments. In the discussion that follows it is assumed that the parameters of capacitance and dissipation factor are measured simultaneously for each selected capacitor. After all capacitors have been measured for these parameters then insulation resistance is measured for each capacitor.

The measurement of capacitance and dissipation factor is effected by the controller 26, as generally indicated at 158.

As seen at 158A the LCR instrument 20 is connected to the selected capacitor by causing the relay control module 110 to close the relay arrangement 80. This is effected by the assertion of the relay coils 81S and 82S over the line 80L. As seen at 158B, the controller 26, under program control, then selects a predetermined one of the capacitors (corresponding to number of the fixture at which testing is to begin). The desired one of the capacitors is selected by closing the corresponding one of the relays 66-1 through 66-N by the controller 26 sending a command to the relay output control 110 which asserts the appropriate one of the coils 66S in the appropriate relay 66 to connect the fixture between the high and low rails 42 and 44, respectively.

From the foregoing it may be appreciated that a predetermined combination of relays in the relay matrix has been energized to connect a predetermined one of the test fixtures with a predetermined one of the measurement devices.

The controller 26 then begins the measurement of at least a predetermined one of the parameters of that selected capacitor. As seen at 158C, the particular one of the measurement devices connected to the particular test fixture via the energized relays in the relay matrix is asserted. In the specific instance under discussion the controller 26 sends a command over the bus 120 to the LCR instrument 20 asserting it to simultaneously measure the capacitance and dissipation factor of the selected capacitor. The instrument performs the measurement and reports the results to the controller 26 over the bus 120. As seen at 158D the result is stored in the memory of the controller 26.

In the particular LCR meter used, capacitance and dissipation factor are measured simultaneously, although they may be measured separately.

As set forth at 158E, once all of the tests being are performed the instrument 20 it is disconnected from the selected capacitor by turning off the relay arrangement 80.

As seen at the call 154-2, the routine 154 is again performed, thus the discharge key 103 is again asserted under program control to dissipate any residual charge on the capacitor.

As seen at 156-2 the overall temperature of the capacitor holding assembly 16 is again measured by causing the digital input module 126 to read the output of the digital temperature measuring device 24.

As generally indicated at 160, the remaining parameter of the selected capacitor, viz., the insulation resistance, is measured. This parameter is obtained by measuring the leakage current of the selected capacitor at one or more predetermined applied electrical potentials. The necessary electrical potential may be obtained in any convenient manner. For example, in the preferred measurement instrument 22 identified above an internal voltage source is associated therewith. Block 160A is a branch to either connect the internal voltage source of picoampere instrument 22 or to connect a separate external voltage source 12. The following paragraph assumes that the internal voltage source of the instrument 22 is used.

To effect the measurement, as seen at 160B, the controller 26 commands the instrument 22 to apply a desired electrical potential (initially specified by the operator) to the selected capacitor. At 160C the controller 26 asserts the appropriate relay arrangement 85 over the lines 87L, 88L from the relay control module 110. Relay 87 connects the measurement terminals of picoampere instrument 22 and relay 88 connects the internal source of voltage potential to the rails 42, 44. As seen at 160D, the controller 26, under program control, then selects a predetermined one of the capacitors. The desired one of the capacitors is selected by closing the corresponding one of the relays 66-1 through 66-N by the controller 26 sending a command to the relay output control 110 which asserts the appropriate one of the coils 66S in the appropriate relay 66 to connect the fixture between the high and low rails 42 and 44, respectively.

The instrument 22 is then asserted, at 160E, by the controller 26 to measure (after a predetermined time delay, if desired) the leakage current through the selected capacitor at this applied voltage. At 160F the reported value of leakage current is stored by the controller 26 in its memory.

If the specified insulation resistance test voltage of the capacitor exceeds te voltage limit of the instrument's internal voltage source, it is necessary to connect a separate external source of voltage to the selected capacitor. In the embodiment illustrated, this separate external source of voltage or potential is supplied from the source 12. As seen at 160C the controller 26 asserts the third relay arrangement 86 over the lines 87L, 98L from the relay control module 110. Relay 87 again connects the measurement terminals of picoampere instrument 22 to the rails 42, 44. The relay 98 connects the supply 12 to the high rail 42 and the common point 94 and thus to the selected capacitor. A similar sequence would be utilized if the picoampere measurement instrument 22 does not contain an internal source of potential. Once the separate external supply is connected, a command is sent from the controller 26 via the digital output module 122 to set the output voltage of the supply 12. Once the external voltage is applied, the instrument 22 measures (after a predetermined time delay, if desired) the leakage current through the selected capacitor at this applied voltage. At 160F the measured value of leakage current is read and stored by the controller 26 in its memory.

Once the given one of the capacitors is measured in the manner outlined above, a different capacitor is selected by opening the previously closed relay 66 and closing the relay 66 associated with next capacitor to be tested. The testing of each selected capacitor proceeds in a fashion corresponding to that discussed heretofore.

If multiple test voltages have been specified by the operator the above sequence (160A through 160F) is repeated for each specified voltage. After the capacitors have been measured at each specified voltage, the capacitor discharge routine 154 is again performed.

At 160G once all the capacitors have been tested the instrument is disconnected from the selected capacitor by turning off the relay arrangement 86.

The overall temperature of the capacitor holding assembly 16 is again measured by causing the digital input module 126 to read the output of the digital temperature measuring device 24.

As seen at the call 154-3, the routine 154 is again performed. The discharge relay 103 is again asserted in a manner identical to that described above.

The controller 26 then signals the operator that the tests have been completed. The operator opens the door D of the holding assembly 16 and removes the capacitors therefrom. At 164 the controller 26 reports the test results in the desired format. Examples of such formats include printed tables of values or plotted histograms of the desired parameters. As seen at 166, the information may also be stored on magnetic media for archival purposes.

Those skilled in the art, having the benefit of the teachings of the present invention, may effect numerous modifications thereto. It should be understood that such modifications are to be construed as lying within the contemplation of the present invention, as defined by the appended claims.

```
10      !...........CAP_DF_IR...         APPENDIX
20      !
30      !
40      ! This program characterizes a maximum of 96 capacitors for
50      ! capacitance, dissipation factor, and insulation resistance at one
60      ! to four voltages.  Histograms are produced for capacitance and
70      ! insulation resistance. Disc file option is available.
```

```
80    !
90    !     The I.R. values of film capacitors are corrected to 25 C
100   !     according to EIA Standard RS-377 (July 1970).
110   !*******************************************
120   !701= 82906A PRINTER; 716= HP4140B pA METER; 717= HP4274 LCR METER;
      723= HP6942
130   !*******************************************
140   !
150   COM /Info/ Job_no$[20],Sample$[80],Remarks$[80],Operator$[20], Type$[30],
      Test_date$[20],File$[10]
160   COM /Condns/ Sample_no,Voltage_no,Voltage,Voltage1,Voltage2,
      Voltage3,Voltage4,Adapter1,Temp_cor,Time,Hz,Test_temp,Bottom1,Cap1,Df1
170   COM /Data/ Data(103,6),Z,W
180   COM /Counters/ Zero_no,Load_no,Times,Plots
190   COM /Calib/ Cal_cap(50),Cal_df(50),Cal_resist1(50),Cal_resist2(50)
200   COM /Bus/ @Meter,Xist_plot,Probes(1:4,1:2),Bus,Testnum(4),
      Viewnum(4),Meter_pa,Lcr,Prt,Plt,Multi
210   COM /Interim/ Cap(96),Df(96),Temp(96),Resist(103)
220   COM /Ok/ Cap_ok
230   !
240   CALL Initial
250   !
260   !MAIN***************************************
270   ! Program cycles from here to account for time to re-zero and calibrate.
280   CLEAR 723
290   CLEAR 716
300   CLEAR 717                                                           150
310   WAIT 5
320              OUTPUT 723;"OB 15 5,1T"    ! 'DONE' light on
330   OUTPUT 1;""
340   OUTPUT 1;""
350    DISP
360    GCLEAR
370   !
380   CALL Memory_clr
390   !
400       IF Zero_no=0 THEN CALL Zero_lcr
410   !
420     CALL Expt_info ————————————————————————————————152
430   !
440   CALL File_option
450   !
460       IF Adapter1=2 AND Load_no*24<Sample_no THEN GOSUB Run
470       IF Adapter1=1 AND Load_no*48<Sample_no THEN GOSUB Run
480       GOSUB Table
490          IF Sample_no=1 THEN GOSUB Finale
500          IF Voltage_no=0 THEN GOTO 530
510          IF Cap_ok=0 THEN GOSUB Finale
520       GOSUB Plot_ir
530       CALL Plot_cap
540    IF File$="0" THEN GOTO 560
550       CALL File
560       CALL Alarm
570       GOSUB Finale
580   !
590 Run:   CALL Load
600        CALL Discharge ————————154-1
620        CALL Cap_df ————————————————————158-1
630        CALL Discharge————————154-2
640        CALL Temp ————————————————————156-2
650          IF Voltage_no=0 THEN GOTO 480
660        CALL In_resist ————————160
670        CALL Temp————————————————————156-3
680        CALL Discharge ————————154-3
```

```
690        GOTO 460
700  !
710  Table:       !
720        Zero_no=Zero_no-1
730        CALL Calc
740        CALL Table                                          162
750        CALL Columns
760        RETURN
770  !
780  Plot_ir:      !
790        ! Histograms
800            IF Plots=Voltage_no THEN GOTO 1080
810            Voltage=Voltage1
820            FOR K=1 TO Sample_no+5
830            Resist(K)=Data(K,3)
840            NEXT K
850            CALL Graph_ir
860            !
870            IF Plots=Voltage_no THEN GOTO 1080
880            Voltage=Voltage2
890            FOR K=1 TO Sample_no+5                           164
900            Resist(K)=Data(K,4)
910            NEXT K
920            CALL Graph_ir
930            !
940            IF Plots=Voltage_no THEN GOTO 1080
950            Voltage=Voltage3
960            FOR K=1 TO Sample_no+5
970            Resist(K)=Data(K,5)
980            NEXT K
990            CALL Graph_ir
1000           !
1010           IF Plots=Voltage_no THEN GOTO 1080
1020           Voltage=Voltage4
1030           FOR K=1 TO Sample_no+5
1040           Resist(K)=Data(K,6)
1050           NEXT K
1060           CALL Graph_ir
1070           !
1080                       RETURN
1090       !
1100 Finale:     !
1110       GOTO 260           ! Repeat test without tripping auto-rezero
1120 !
1130 END
1140 !*******************************************
1150 SUB Initial  !
1160 !*******************************************
1170 !
1180 COM /Bus/ @Meter,Xist_plot,Probes(1:4,1:2),Bus,Testnum(4),Viewnum (4),
        Meter_pa,Lcr,Prt,Plt,Mult
1190 !
1200 DISP                  ! Clear Display line                 150
1210 OUTPUT 1 USING "@"     ! Clear CRT
1220 Bus_=716    ! Optional Bus address
1230 READ Testnum(*),Viewnum(*)! Sets up the order in which measurements are
        made & displayed
1240 DATA -1,-2,4,2,3,0,3,1,4,2
1250 PRINTER IS 1
1260 DISP "Initializing the system"
1270    DIM Message$[50]       ! STRING CONTAINING USER MESSAGE
1280    INTEGER Address        ! HOLDS HPIB ADDRESS DURING BUS SCAN
1290    INTEGER Bstatus        ! HPIB STATUS REG CONTENTS
1300 !
```

```
1310    Xist_4140=0
1320    Xist_4274=0
1330    Xist_plot=0
1340    Xist_prt=0
1350    Xist_multi=0
1360  !
1370  ! INITIALIZE   DEVICE ADDRESSES
1380    Meter_pa=716         ! default
1390    Lcr=717
1400    Prt=701
1410    Plt=705
1420    Multi=723
1430    Bus=7
1440  !
1450    Message$=" 1: THE NUMBER "&VAL$(Bus)&" IS NOT A VALID SELECT CODE"
1460    IF Bus<7 OR Bus>31 THEN Terminate
1470  !
1480    Message$=" 1: THE NUMBER "&VAL$(Meter_pa)&" IS NOT A VALID RECORDER
        ADDRESS"
1490    IF Meter_pa MOD 100>30 THEN Terminate
1500  !
1510    Message$=" 2: NO INTERFACE FOUND AT SELECT CODE "&VAL$(Bus)        150
1520    ON ERROR GOTO Terminate
1530    STATUS Bus,0;Bstatus
1540  !
1550    Message$=" 3: THE INTERFACE AT SELECT CODE "&VAL$(Bus)&" IS NOT HP-IB"
1560    IF Bstatus<>1 THEN Rsterminate
1570  !
1580    STATUS Bus,3;Bstatus
1590    IF BIT(Bstatus,6) THEN Actcon
1600    Message$=" 4: 9826 IS NOT ACTIVE CONTROLLER"
1610    GOTO Rsterminate
1620  Actcon:  ! 9826 is active controller
1630    ON TIMEOUT Bus,1 GOTO Nodevices
1640    SEND Bus;UNL      ! UNLISTEN THE BUS
1650    SEND Bus;UNT      ! UNTALK   THE BUS
1660    OFF TIMEOUT Bus   ! do not delete 'Bus'
1670    OFF ERROR
1680  !
1690  ! CHECK FOR EQUIPMENT ON BUS AT ALL ADDRESSES AND PRINT DEVICE NAMES
1700    OUTPUT 1 USING "///,8X,K,DD";" EQUIPMENT PRESENT ON BUS #";Bus
1710    OUTPUT 1 USING "8X,""--------------------------------"",/"
1720  !
1730  ! cancel any perverse LOCAL Bus
1740    IF BIT(Bstatus,7) THEN ! must be system
1750        REMOTE Bus          ! controller to
1760    END IF                  ! do this
1770                            !
1780    FOR Address=Bus*100 TO Bus*100+30
1790      OUTPUT Address USING "#"              ! ADDRESS DEVICE TO
        LISTEN, Bus TO TALK
1800      WAIT .1             ! slow handshake ok   !
1810      STATUS Bus,7;Bstatus ! DID IT LISTEN?
1820      SEND Bus;DATA       ! Unhang 37201A
1830      IF BIT(Bstatus,13) THEN
1840      ! DEVICE PRESENT (NDAC came True)
1850        Message$="Device Unknown"
1860        IF Address=Prt THEN GOSUB System_printer
1870        IF Address=Plt THEN GOSUB System_plotter
1880        IF Address=Lcr THEN GOSUB Meter_lcr
1890        IF Address=Meter_pa THEN GOSUB Meter_pa
1900        IF Address=Multi THEN GOSUB Multi
1910        OUTPUT 1 USING Fmt;Message$,Address MOD 100
1920      END IF
```

```
1930 Nxt: NEXT Address
1940 !
1950     STATUS Bus,3;Bstatus
1960     OUTPUT 1 USING Fmt;"System Computer",BINAND(Bstatus,31)
1970     IF NOT Xist_prt THEN Prt=1 ! use 9826 CRT
1980 !
1990     Message$=" 6: 4140B NOT PRESENT OR NOT ADDRESSED"
2000     IF NOT Xist_4140 THEN Rsterminate
2010     OUTPUT 1 USING "/"
2020     SUBEXIT ! all well.......
2030  !
2040  !
2050 Fmt: IMAGE X,27A,"    at address ",2Z
2060  !
2070 System_printer: !
2080     Message$="System Printer"
2090     Xist_prt=1
2100     RETURN
2110  !
2120 System_plotter: !
2130     Xist_plot=1
2140     Message$="System Plotter"
2150     RETURN
2160  !
2170 Multi:  !                                                           150
2180     Xist_multi=1
2190     Message$="6942A Multiprogrammer"
2200     RETURN
2210     !
2220 Meter_lcr: ON TIMEOUT Bus,3 GOTO Timeout81
2230     Message$="4274A LCR Meter"
2240     ASSIGN @Meter TO 717
2250     OUTPUT @Meter;"SR0"           ! Clear 4274A interrupt mask (srq)
2260     CLEAR 717
2270     OFF TIMEOUT Bus
2280     Xist_4274=1
2290     RETURN
2300     !
2310 Meter_pa: ON TIMEOUT Bus,3 GOTO Timeout80
2320     Message$="4140B Pa Meter"
2330     ASSIGN @Meter TO Meter_pa
2340     OUTPUT @Meter;"SR0"           ! Clear 4140B interrupt mask (srq)
2350     CLEAR 716
2360     OFF TIMEOUT Bus
2370     Xist_4140=1
2380     !
2390     RETURN
2400 !
2410 Timeout81:            ! ERROR TRAPS
2420     Message$=" 7: 4274A NOT ADDRESSED"
2430     GOTO Rsterminate
2440     !
2450 Timeout80:            ! ERROR TRAPS
2460     Message$=" 7: 4140B NOT ADDRESSED"
2470     GOTO Rsterminate
2480  !
2490 Nodevices: !
2500     Message$=" 5: NO DEVICES ON HP-IB SELECT CODE "&VAL$(Bus)
2510  !
2520 Rsterminate:          ! RESET INTERFACE
2530     CONTROL Bus,0;1
2540 Terminate: !
2550     OFF ERROR
2560     PRINT "PROGRAM TERMINATED."
2570     STOP!
```

```
2580  !
2590  SUBEND   !_____
2600  !*******************************************
2610     SUB Memory_clr !
2620  !*******************************************
2630    COM /Info/ Job_no$[20], Sample$[80],Remarks$[80], Operator $[20],
         Type$[30],Test_date$[20],File$[10]
2640    COM /Condns/ Sample_no,Voltage_no,Voltage,Voltage1, Voltage2, Voltage3,
         Voltage4,Adapter1,Temp_cor,Time,Hz,Test_temp,Bottom1,Cap1,Df1
2650    COM /Data/ Data(103,6),Z,W
2660    COM /Counters/ Zero_no,Load_no,Times,Plots
2670    COM /Calib/ Cal_cap(50),Cal_df(50),Cal_resist1(50),Cal_resist2(50)
2680    COM /Interim/ Cap(96),Df(96),Temp(96),Resist(103)
2690  !
2700       Job_no$=""
2710       Sample$=""
2720       Remarks$=""
2730       Operator$=""
2740       Type$=""
2750  !
2760       Time=0
2770       Hz=0
2780       Test_temp=0
2790       Bottom1=0
2800       Cap1=0
2810       Df1=0
2820       Cap_ok=0
2830       Df_ok=0
2840       R1_ok=0
2850       R2_ok=0
2860       R3_ok=0
2870       R4_ok=0
2880       Sample_no=0
2890       Voltage_no=0
2900       Volt_bert=0
2910       Load_no=0
2920       Times=0
2930       Plots=0
2940       Voltage=0
2950       Voltage1=0
2960       Voltage2=0
2970       Voltage3=0
2980       Voltage4=0
2990       Adapter1=0
3000       Temp_cor=0
3010       Z=0
3020       W=0
3030       Q=0
3040  !
3050       FOR I=0 TO 103
3060          FOR J=0 TO 6
3070                Data(I,J)=0
3080          NEXT J
3090       NEXT I
3100  !
3110       FOR I=1 TO 50
3120          Cal_cap(I)=0
3130          Cal_df(I)=0
3140          Cal_resist1(I)=0
3150          Cal_resist2(I)=0
3160       NEXT I
3170  !
3180  SUBEND   !_____
3190  !*******************************************
```

```
3200         SUB Zero_lcr !   (each ten analyses)
3210 !********************************************
3220 COM /Counters/ Zero_no,Load_no,Times,Plots
3230                OUTPUT 1;""
3240                OUTPUT 1;""
3250                OUTPUT 1;""
3260                OUTPUT 1;"The LCR meter must be zeroed. Remove samples from
       positions 9,25 & 41 and press 'CONTINUE'."
3270                GOSUB Beep2
3280 PAUSE
3290 OUTPUT 1 USING "@"
3300 DISP "LCR meter is being zeroed...................."
3310 OUTPUT 723;"OB 15 0,1T"          ! Close main cap + df relay
3320      OUTPUT 723;"OB 12 08,1T"    ! Close position #9 relay
3330      OUTPUT 723;"OB 13 08,1T"    ! Close position #25 relay
3340      OUTPUT 723;"OB 14 08,1T"    ! Close position #41 relay
3350      WAIT 2
3360      REMOTE 717                  ! Control LCR meter remotely
3370      OUTPUT 717;"ZO"             ! Zero LCR meter
3380      WAIT 14
3390      OUTPUT 723;"OB 15 0,0T"     ! Open main cap + df relay
3400      OUTPUT 723;"OB 12 08,0T"    ! Open position #9 relay
3410      OUTPUT 723;"OB 13 08,0T"    ! Open position #25 relay
3420      OUTPUT 723;"OB 14 08,0T"    ! Open position #41 relay
3430      BEEP
3440           Zero_no=10             ! Restart counter
3450             OUTPUT 1;""
3460             OUTPUT 1;""
3470             OUTPUT 1;"Zeroing of LCR meter is complete."
3480 DISP
3490 CLEAR 717
3500 WAIT 2
3510      SUBEXIT
3520 Beep2:         !
3530             BEEP 130,.3
3540             WAIT .1
3550             BEEP 250,.3
3560             WAIT .1
3570             BEEP 150,.3
3580             WAIT .1
3590             BEEP 230,.3
3600             RETURN
3610 !
3620 SUBEND     !_____
3630 !********************************************
3640      SUB Expt_info    !
3650 !********************************************
3660   COM /Info/ Job_no$[20], Sample $[80],Remarks $[80], Operator$[20],
       Type$[30],Test_date $[20],File$[10]
3670 COM /Condns/ Sample_no,Voltage_no, Voltage,Voltage1, Voltage2,
3680 Voltage3, Voltage4, Adapt   er1,Temp_cor, Time, Hz,Test_temp, Bottom1,
3690 Cap1, Df1
3700  !
3710   OUTPUT 1 USING "@"
3720 DISP
3730 GOSUB Clear_menu
3740   GCLEAR
3750 GINIT
3760   !
3770 GOTO 3820
3780 OUTPUT 1 USING "@"
3790 GOSUB Clear_menu
3800 OUTPUT 1 USING "@"
3810 OUTPUT 1;"ENTER CORRECTED INFORMATION NOW."
```

```
3820 GOSUB Cap_type
3830         CALL Check
3840 GOSUB Cap_type   LINPUT "OPERATOR",Operator$
3850         IF Type$="STD" THEN GOTO 3980
3860 LINPUT "JOB NUMBER",Job_no$
3870 LINPUT "SAMPLE DESCRIPTION",Sample$
3880 LINPUT "REMARKS",Remarks$
3890 INPUT "NUMBER OF SAMPLES",Sample_no
3900 !
3910            GOSUB Clear_menu
3920      GOSUB Adapter
3930            GOSUB Clear_menu
3940      GOSUB Volt_no
3950            GOSUB Clear_menu
3960      GOSUB Volt_val
3970            GOSUB Clear_menu
3980      GOSUB Verify
3990      GOSUB Option
4000            GOSUB Clear_menu
4010      GOSUB End
4020 Cap_type: !
4030      DISP "WHAT IS CAPACITOR TYPE ?"
4040      Adapter1=1
4050      ON KEY 5 LABEL "MET PET" GOTO 4200
4060      ON KEY 6 LABEL "MET OTHR" GOTO 4250
4070      ON KEY 7 LABEL "FLM/FOIL" GOTO 4300
4080      ON KEY 8 LABEL "   MLC" GOTO 4340
4090      ON KEY 9 LABEL "   STD" GOTO 4390
4100      ON KEY 4 LABEL "UNKNOWN" GOTO 4610
4110      ON KEY 0 LABEL "ZERO LCR" GOTO 4150
4120      X=0
4130 IF X=0 THEN GOTO 4130
4140      !
4150      ! Option for special lcr zero.......
4160            GOSUB Clear_menu
4170            CALL Zero_lcr
4180            GOSUB Cap_type
4190            !
4200                Type$="METALLIZED PET"
4210                Temp_cor=1
4220                Cap1=.25
4230                Df1=1
4240                RETURN
4250                Type$="METALLIZED FILM"
4260                Temp_cor=0
4270                Cap1=.25
4280                Df1=1
4290                RETURN
4300                Type$="FILM/FOIL"
4310                Cap1=.25
4320                Df1=1
4330                RETURN
4340                Type$="MULTILAYER CERAMIC"
4350                Cap1=.25
4360                Df1=3
4370                RETURN
4380      !
4390      ! Input for standard capacitors
4400         GOSUB Clear_menu
4410         CALL Zero_lcr
4420            OUTPUT 1 USING "@"
4430            DISP "Insert disk and press 'CONTINUE'......."
4440            PAUSE
4450                Type$="STD"
```

```
4460            One$="STD:"
4470            Two$=DATE$(TIMEDATE)
4480            Job_no$=One$&Two$[4,6]&Two$[10,11]
4490            Sample$="STANDARD METALLIZED PC FILM HERMETICS"
4500            Remarks$="CALIBRATION TEST"
4510            Temp_cor=1
4520            Voltage_no=1
4530            Voltage1=100
4540            Adapter1=1
4550            Adapter$="NO"
4560            Sample_no=48
4570            Cap1=.25
4580            Df1=1
4590            RETURN
4600    !
4610            Type$="UNKNOWN"
4620            Cap1=.25
4630            Df1=5
4640            RETURN
4650 !
4660 Adapter:   !
4670   DISP "Are adapters used in odd positions ?"
4680              ON KEY 5 LABEL "    NO" GOTO 4720
4690              ON KEY 9 LABEL "   YES" GOTO 4750
4700       X=0
4710       IF X=0 THEN GOTO 4710
4720            Adapter1=1
4730            Adapter$="NO"
4740            RETURN
4750            Adapter1=2
4760            Adapter$="YES"
4770            RETURN
4780         !
4790 Volt_no:   !
4800   DISP "How many voltages for I.R. determinations ?"
4810              ON KEY 5 LABEL "    0" GOTO 4880
4820              ON KEY 6 LABEL "    1" GOTO 4900
4830              ON KEY 7 LABEL "    2" GOTO 4920
4840              ON KEY 8 LABEL "    3" GOTO 4940
4850              ON KEY 9 LABEL "    4" GOTO 4960
4860       X=0
4870       IF X=0 THEN GOTO 4870
4880            Voltage_no=0
4890            RETURN
4900            Voltage_no=1
4910            RETURN
4920            Voltage_no=2
4930            RETURN
4940            Voltage_no=3
4950            RETURN
4960            Voltage_no=4
4970            RETURN
4980 !
4990 Volt_val:   !
5000            IF Voltage_no=0 THEN RETURN
5010        FOR I=0 TO Voltage_no-1
5020          INPUT "Enter a voltage .",Volt(I)
5030            NEXT I
5040        MAT SORT Volt(*) DES           ! To assure lowest voltage first
5050            IF Voltage_no=1 THEN GOTO 5070
5060            GOTO 5090
5070                 Voltage1=Volt(0)
5080                 GOTO 5260
5090            IF Voltage_no=2 THEN GOTO 5110
5100            GOTO 5140
```

152

```
5110                    Voltage1=Volt(1)
5120                    Voltage2=Volt(0)
5130                    GOTO 5260
5140           IF Voltage_no=3 THEN GOTO 5160
5150           GOTO 5200
5160                    Voltage1=Volt(2)
5170                    Voltage2=Volt(1)
5180                    Voltage3=Volt(0)
5190                    GOTO 5260
5200           IF Voltage_no=4 THEN GOTO 5220
5210           GOTO 5260
5220                    Voltage1=Volt(3)
5230                    Voltage2=Volt(2)
5240                    Voltage3=Volt(1)
5250                    Voltage4=Volt(0)
5260      RETURN
5270 !
5280 Verify:      !  Verify input information
5290      OUTPUT 1 USING "@"
5300      OUTPUT 1;""
5310      OUTPUT 1;""
5320      OUTPUT 1;"JOB NUMBER: ";Job_no$
5330      OUTPUT 1;""
5340      OUTPUT 1;"CAPACITOR DESCRIPTION: ";Sample$
5350      OUTPUT 1;""
5360      OUTPUT 1;"REMARKS: ";Remarks$
5370      OUTPUT 1;""
5380      OUTPUT 1;"CAPACITOR TYPE: ";Type$
5390      OUTPUT 1;""
5400      OUTPUT 1;"ADAPTERS USED ?   ";Adapter$
5410      OUTPUT 1;""
5420      OUTPUT 1;"OPERATOR: ";Operator$
5430      OUTPUT 1;""
5440      OUTPUT 1;"NUMBER OF SAMPLES: ";Sample_no;"    NO. OF VOLTAGES: ";Voltage_no
5450      OUTPUT 1;""
5460      IF Voltage_no=4 THEN GOTO 5510
5470      IF Voltage_no=3 THEN GOTO 5530
5480      IF Voltage_no=2 THEN GOTO 5550
5490      IF Voltage_no=1 THEN GOTO 5570
5500      IF Voltage_no=0 THEN GOTO 5590
5510      OUTPUT 1;"I.R. VOLTAGE CONDITIONS: ";Voltage1, Voltage2, Voltage3, Voltage4
5520           RETURN
5530      OUTPUT 1;"I.R. VOLTAGE CONDITIONS: ";Voltage1,Voltage2,Voltage3
5540           RETURN
5550      OUTPUT 1;"I.R. VOLTAGE CONDITIONS: ";Voltage1,Voltage2
5560           RETURN
5570      OUTPUT 1;"I.R. VOLTAGE CONDITIONS: ";Voltage1
5580           RETURN
5590      OUTPUT 1;"I.R. VOLTAGE CONDITIONS: ";"   None"
5600           RETURN
5610 Option:     !
5620           DISP "Is this information correct ?"
5630 !
5640           ON KEY 5 LABEL "   NO" GOTO 3780
5650           ON KEY 9 LABEL "  YES" GOTO 5680
5660      X=0
5670      IF X=0 THEN GOTO 5670
5680           RETURN
5690 !
5700 Clear_menu:  !
5710           OUTPUT 1 USING "@"
5720           DISP
```

```
5730            CONTROL 1,12;0
5740            FOR I=0 TO 19
5750            ON KEY I LABEL "         " GOSUB Beep
5760            NEXT I
5770            RETURN
5780 !
5790 Beep:  BEEP
5800        RETURN
5810 !
5820 End:   !
5830            SUBEXIT
5840            !
5850  SUBEND   !
5860 !*******************************************
5870         SUB Load !
5880 !*******************************************
5890  COM /Condns/ Sample_no, Voltage_no, Voltage,Voltage1, Voltage2, Voltage3,
         Voltage4, Adapter1, Temp_cor, Time,Hz, Test_temp, Bottom1, Cap1,Df1
5900  COM /Counters/ Zero_no,Load_no,Times,Plots
5910 !
5920         OUTPUT 1 USING "@"
5930         DISP
5940 !
5950         IF Adapter1=2 THEN GOSUB Adapter
5960         IF Adapter1=1 THEN GOSUB No_adapter
5970 !
5980 No_adapter:  !
5990         IF Load_no=0 AND Sample_no=48 THEN GOSUB Load1
6000         IF Load_no=0 AND Sample_no<48 THEN GOSUB Load1
6010         IF Load_no=0 AND Sample_no>48 THEN GOSUB Load2
6020         IF Load_no=1 AND Sample_no>48 THEN GOSUB Load3
6030 !
6040 Adapter:        !
6050 !
6060        IF Load_no>0 THEN GOTO 6130
6070 !
6080     GOSUB Beep1
6090     DISP " Adapters must be used in odd number sockets! Press 'CONTINUE'."
6100     PAUSE
6110     DISP
6120 !
6130         IF Load_no=0 AND Sample_no=24 THEN GOSUB Load01
6140         IF Load_no=0 AND Sample_no<24 THEN GOSUB Load01
6150         IF Load_no=0 AND Sample_no>24 THEN GOSUB Load02
6160 !
6170         IF Load_no=1 AND Sample_no=48 THEN GOSUB Load03
6180         IF Load_no=1 AND Sample_no<48 THEN GOSUB Load03
6190         IF Load_no=1 AND Sample_no>48 THEN GOSUB Load04
6200 !
6210         IF Load_no=2 AND Sample_no>72 THEN GOSUB Load06
6220 !
6230         IF Load_no=2 AND Sample_no>48 THEN GOSUB Load05
6240 !
6250         IF Load_no=3 AND Sample_no>72 THEN GOSUB Load07
6260         RETURN
6270 !
6280 Load01:         !
6290            DISP "Load ";Sample_no;" capacitors and press 'CONTINUE'."
6300            GOSUB Beep2
6310            PAUSE
6320            DISP
6330            Load_no=1
6340            SUBEXIT
6350!
6360 Load02:        !
```

```
6370            DISP "Load 24 capacitors and press 'CONTINUE'."
6380            GOSUB Beep2
6390            PAUSE
6400            DISP
6410            Load_no=1
6420            SUBEXIT
6430!
6440 Load03:    !
6450            DISP "Load ";Sample_no-24;" capacitors and press 'CONTINUE'."
6460            GOSUB Beep2
6470            PAUSE
6480            DISP
6490            Load_no=2
6500            SUBEXIT
6510!
6520 Load04:    !
6530            DISP "Load 24 capacitors and press 'CONTINUE'."
6540            GOSUB Beep2
6550            PAUSE
6560            DISP
6570            Load_no=2
6580            SUBEXIT
6590!
6600 Load05:    !
6610            DISP "Load ";Sample_no-48;" capacitors and press 'CONTINUE'."
6620            GOSUB Beep2
6630            PAUSE
6640            DISP
6650            Load_no=3
6660            SUBEXIT
6670!
6680 Load06:    !
6690            DISP "Load 24 capacitors and press 'CONTINUE'."
6700            GOSUB Beep2
6710            PAUSE
6720            DISP
6730            Load_no=3
6740            SUBEXIT
6750 !
6760 Load07:    !
6770            DISP "Load ";Sample_no-72;" capacitors and press 'CONTINUE'."
6780            GOSUB Beep2
6790            PAUSE
6800            DISP
6810            Load_no=4
6820            SUBEXIT
6830!
6840       GOTO 7280
6850 !
6860 Load1:     !
6870       DISP "Load ";Sample_no;" capacitors and press 'CONTINUE'."
6880       GOSUB Beep2
6890       PAUSE
6900       DISP
6910       Load_no=1
6920       SUBEXIT
6930 !
6940 Load2:     !
6950       DISP "Load 48 capacitors and press 'CONTINUE'."
6960       GOSUB Beep2
6970       PAUSE
6980       DISP
6990       Load_no=1
```

```
7000        SUBEXIT
7010 !
7020 Load3:      !
7030      DISP "Load ";Sample_no-48;"capacitors and press 'CONTINUE'."
7040      GOSUB Beep2
7050      PAUSE
7060      DISP
7070      Load_no=2
7080      SUBEXIT
7090 !
7100 Beep1:           !
7110                  BEEP
7120                  WAIT .1
7130                  BEEP
7140                  WAIT .1
7150                  BEEP
7160                  RETURN
7170 !
7180 Beep2:           !
7190                  BEEP 130,.3
7200                  WAIT .1
7210                  BEEP 250,.3
7220                  WAIT .1
7230                  BEEP 150,.3
7240                  WAIT .1
7250                  BEEP 230,.3
7260                  RETURN
7270 !
7280  SUBEND   !
7290 !*******************************************
7300   SUB Discharge
7310 !*******************************************
7320  COM /Condns/ Sample_no, Voltage_no,Voltage, Voltage1,Voltage2,Voltage3,
      Voltage4,Adapter1,Temp_cor,Time,Hz,Test_temp,Bottom1,Cap1,Df1
7330 COM /Counters/ Zero_no,Load_no,Times,Plots
7340 !
7350             DISP "Discharging positions in use.............."
7360    GOSUB Open
7370    GOSUB Close
7380    GOSUB Load
7390    GOSUB Count
7400    GOSUB Open
7410    GOTO 8130
7420 Open:                        !
7430                    CLEAR 723 ! At least 3 sec reqired to execute
7440                    WAIT 3
7450                    RETURN
7460 Close:                       !
7470                    OUTPUT 723;"OB 15 4,1T"
7480                    WAIT 1
7490                    RETURN
7500    !
7510 Load:   !
7520             Position=0
7530             IF Load_no=1 THEN Position=Sample_no*Adapter1
7540             IF Load_no=2 THEN Position=(Sample_no*Adapter1)-48
7550             IF Load_no=3 THEN Position=(Sample_no*Adapter1)-96
7560             IF Load_no=4 THEN Position=(Sample_no*Adapter1)-144
7570             RETURN
7580             !
7590 Count:   !
7600             IF Position<17 THEN GOSUB Bank1
7610             IF Position>16 AND Position<33 THEN GOSUB Bank2
7620             IF Position>32 AND Position<48 THEN GOSUB Bank3
7630             IF Position>47 THEN GOSUB Bank4
```

```
7640              RETURN
7650 Bank1:                    !
7660              FOR K=0 TO Position-1 STEP Adapter1
7670                  OUTPUT 723;"OB 12",K,"1T"
7680                  WAIT .5
7690                  OUTPUT 723;"OB 12",K,"0T"
7700              NEXT K
7710              RETURN
7720 Bank2:                    !
7730              FOR K=0 TO 15 STEP Adapter1
7740                  OUTPUT 723;"OB 12",K,"1T"
7750                  WAIT .5
7760                  OUTPUT 723;"OB 12",K,"0T"
7770              NEXT K
7780              FOR K=0 TO Position-17 STEP Adapter1
7790                  OUTPUT 723;"OB 13",K,"1T"
7800                  WAIT .5
7810                  OUTPUT 723;"OB 13",K,"0T"
7820              NEXT K
7830              RETURN
7840 Bank3:                    !
7850              FOR K=0 TO 15 STEP Adapter1
7860                  OUTPUT 723;"OB 12",K,"1T"
7870                  WAIT .5
7880                  OUTPUT 723;"OB 12",K,"0T"
7890                  OUTPUT 723;"OB 13",K,"1T"
7900                  WAIT .5
7910                  OUTPUT 723;"OB 13",K,"0T"
7920              NEXT K
7930              FOR K=0 TO Position-33 STEP Adapter1
7940                  OUTPUT 723;"OB 14",K,"1T"
7950                  WAIT .5
7960                  OUTPUT 723;"OB 14",K,"0T"
7970              NEXT K
7980              RETURN
7990 Bank4:                    !
8000              FOR K=0 TO 15 STEP Adapter1
8010                  OUTPUT 723;"OB 12",K,"1T"
8020                  WAIT .5
8030                  OUTPUT 723;"OB 12",K,"0T"
8040                  OUTPUT 723;"OB 13",K,"1T"
8050                  WAIT .5
8060                  OUTPUT 723;"OB 13",K,"0T"
8070                  OUTPUT 723;"OB 14",K,"1T"
8080                  WAIT .5
8090                  OUTPUT 723;"OB 14",K,"0T"
8100              NEXT K
8110              CLEAR 723
8120              WAIT 3
8130     SUBEND  !
8140 !*******************************************
8150 SUB Cap_df !
8160 !*******************************************
8170 COM /Condns/ Sample_no, Voltage_no, Voltage,Voltage1,Voltage2, Voltage3,
         Voltage4,Adapter1,Temp_cor,Time,Hz,Test_temp,Bottom1,Cap1,Df1
8180 COM /Data/ Data(103,6),Z,W
8190 COM /Interim/ Cap(96),Df(96),Temp(96),Resist(103)
8200  !
8210 DISP " Measuring capacitance and disipation factor..."
8220  !
8230 Hz=1000
8240  !
8250   OUTPUT 1 USING "1X,3A,5X,7A,5X,7A";"No.","Cap.,uF","D.F.,%"
8260   OUTPUT 1 USING  "1X,49A";"........ ........."
8270   OUTPUT 1;""
```

```
8280                                              ! All relays are open.
8290            REMOTE 717                        ! LCR meter controlled remotely
8300            OUTPUT 723;"OB 15 0,1T"           ! Close main cap + df relay     158A
8310 !..........1st 15 samples
8320       FOR K=0 TO 15 STEP Adapter1
8330    Z=Z+1
8340            OUTPUT 723;"OB 12",K,"1T"! Close sample 1-16 relay                158B
8350            WAIT 2
8360            OUTPUT 717;"A2T1"         ! Set to measure cap + df               158C
8370            OUTPUT 717;"E"            ! Take reading
8380            ENTER 717;Cap(Z),Df(Z)    ! Transfer to 9826                      158D
8390            OUTPUT 723;"QB 12",K,"0T"! Open sample 1-15 relay
8400    Data(Z,1)=Cap(Z)*10^6
8410    Data(Z,2)=Df(Z)*100
8420    OUTPUT 1 USING "1DDD,#";Z
8430    IF Data(Z,1)>99 THEN Data(Z,1)=0
8440    IF Data(Z,1)<0 THEN Data(Z,1)=0
8450    OUTPUT 1 USING "5DD.DDDD,#";Data(Z,1)
8460    IF Data(Z,2)>99 THEN Data(Z,2)=0
8470    IF Data(Z,2)<0 THEN Data(Z,2)=0
8480    OUTPUT 1 USING "5DD.DD";Data(Z,2)
8490 !
8500        IF Z=Sample_no THEN GOSUB Finish
8510 !
8520        NEXT K
8530 !
8540 ! ..........2nd 15 samples........
8550       FOR K=0 TO 15 STEP Adapter1
8560    Z=Z+1
8570            OUTPUT 723;"OB 13",K,"1T"! Close sample 17-32 relay
8580            WAIT 2
8590            OUTPUT 717;"A2T1"         ! Set to measure cap + df
8600            OUTPUT 717;"E"            ! Take reading
8610            ENTER 717;Cap(Z),Df(Z)    ! Transfer to 9826
8620            OUTPUT 723;"OB 13",K,"0T"! Open sample 17-32 relay
8630    Data(Z,1)=Cap(Z)*10^6
8640    Data(Z,2)=Df(Z)*100
8650    OUTPUT 1 USING "1DDD,#";Z
8660    IF Data(Z,1)>99 THEN Data(Z,1)=0
8670    IF Data(Z,1)<0 THEN Data(Z,1)=0
8680    OUTPUT 1 USING "5DD.DDDD,#";Data(Z,1)
8690    IF Data(Z,2)>99 THEN Data(Z,2)=0
8700    IF Data(Z,2)<0 THEN Data(Z,2)=0
8710    OUTPUT 1 USING "5DD.DD";Data(Z,2)
8720 !
8730        IF Z=Sample_no THEN GOSUB Finish
8740 !
8750        NEXT K
8760 !
8770 !..........3rd 15 samples..........
8780       FOR K=0 TO 15 STEP Adapter1
8790    Z=Z+1
8800            OUTPUT 723;"OB 14",K,"1T"! Close sample 33-48 relay
8810            WAIT 2
8820            OUTPUT 717;"A2T1"         ! Set to measure cap + df
8830            OUTPUT 717;"E"            ! Take reading
8840            ENTER 717;Cap(Z),Df(Z)    ! Transfer to 9826
8850            OUTPUT 723;"OB 14",K,"0T"! Open sample 33-48 relay
8860    Data(Z,1)=Cap(Z)*10^6
8870    Data(Z,2)=Df(Z)*100
8880    OUTPUT 1 USING "1DDD,#";Z
8890    IF Data(Z,1)>99 THEN Data(Z,1)=0
8900    IF Data(Z,1)<0 THEN Data(Z,1)=0
8910    OUTPUT 1 USING "5DD.DDDD,#";Data(Z,1)
```

```
8920       IF Data(Z,2)>99 THEN Data(Z,2)=0
8930       IF Data(Z,2)<0 THEN Data(Z,2)=0
8940       OUTPUT 1 USING "5DD.DD";Data(Z,2)
8950 !
8960       IF Z=Sample_no THEN GOSUB Finish
8970 !
8980       NEXT K
8990 !
9000 Finish:    OUTPUT 723;"OB 15 0,0T"  ! Open main cap + df relay
9010           CLEAR 717
9020           WAIT 5
9030           DISP
9040           SUBEXIT
9050 !
9060 DISP
9070 SUBEND   !
9080 !*******************************************
9090 SUB In_resist !
9100 !*******************************************
9110 !
9120   COM /Condns/ Sample_no, Voltage_no,Voltage, Voltage1,Voltage2,Voltage3,
        Voltage4,Adapter1,Temp_cor,Time,Hz,Test_temp,Bottom1,Cap1,Df1
9130   COM /Data/ Data(103,6),Z,W
9140   COM /Counters/ Zero_no,Load_no,Times,Plots
9150   COM /Interim/ Cap(96),Df(96),Temp(96),Resist(103)
9160 !
9170 OUTPUT 1 USING "@"
9180 DISP " Measuring insulation resistance.........."
9190 !
9200   Time=60
9210       GOSUB Heading
9220 ! Run voltage in ascending value.
9230          ! Voltage1
9240              Voltage=Voltage1
9250              W=0
9260              Times=1
9270           IF Voltage=0 THEN GOTO 9300
9280           IF Voltage<100 OR Voltage=100 THEN GOSUB Meter
9290           IF Voltage>100 THEN GOSUB Bertan
9300       !Voltage2
9310              Voltage=Voltage2
9320              W=0
9330              Times=2
9340           IF Voltage=0 THEN GOTO 9370
9350           IF Voltage<100 OR Voltage=100 THEN GOSUB Meter
9360           IF Voltage>100 THEN GOSUB Bertan
9370       ! Voltage3
9380              Voltage=Voltage3
9390              W=0
9400              Times=3
9410           IF Voltage=0 THEN GOTO 9440
9420           IF Voltage<100 OR Voltage=100 THEN GOSUB Meter
9430           IF Voltage>100 THEN GOSUB Bertan
9440       ! Voltage4
9450              Voltage=Voltage4
9460              W=0
9470              Times=4
9480           IF Voltage=0 THEN GOTO 9510
9490           IF Voltage<100 OR Voltage=100 THEN GOSUB Meter
9500           IF Voltage>100 THEN GOSUB Bertan
9510 !
9520 SUBEXIT
9530 !
9540 Heading:          !
9550 OUTPUT 1;""
```

```
9560 OUTPUT 1;""
9570     OUTPUT 1 USING "1X,3A,5X,7A,5X, 8A,4X,6A,3X,7A"; "No.", "Cap.uf",
     "D.F.,%","I.R.","Voltage"
9580 OUTPUT 1;"......................................."
9590 OUTPUT 1;""
9600 RETURN
9610 !
9620 !
9630 Meter:                      ! To use the 4140B as voltage source
9640                       REMOTE 716
9650                       OUTPUT 716;"F1RA1I3T1L2"                    160B
9660                       WAIT 1
9670           OUTPUT 723;"OB 15 3, 0T" ! Open relay from Bertan
9680           OUTPUT 716;"A5"          ! 4140B voltage source on
9690           OUTPUT 716;"PA";Voltage  ! Set voltage level from 4140B
9700           OUTPUT 723;"OB 15 6,1T"  ! Close va relay from 4140B
9710           OUTPUT 723;"OB 15 1, 1T" ! Close pA current measuring relay
9720           OUTPUT 723;"OB 15 2, 1T" ! High voltage light on        160D
9730 !
9740      FOR K=0 TO 15 STEP Adapter1
9750          ! Bring pA meter to zero
9760          OUTPUT 723;"OB 15 1, 0T" ! Open pA current measuring relay
9770      WAIT 7                       ! Time for pA meter to settle
9780          OUTPUT 716;"Z"           ! Zero pA meter(i.e. blank value)
9790          OUTPUT 723;"OB 15 1, 1T" ! Close pA current measuring relay
9800          !
9810      IF W=0 THEN GOTO 9850
9820      IF W<16*Load_no/Adapter1 THEN GOTO 9850
9830      IF W<32*Load_no/Adapter1 THEN GOTO 9880
9840      IF W<48*Load_no/Adapter1 THEN GOTO 9910
9850              OUTPUT 723;"OB 12",K,"1T"! Close sample 1-16 relay
9860              GOTO 9930
9870          !
9880              OUTPUT 723;"OB 13",K,"1T"! Close sample 17-32 relay
9890              GOTO 9930
9900          !
9910              OUTPUT 723;"OB 14",K,"1T"! Close sample 33-48 relay
9920          !
9930      WAIT 1
9940          OUTPUT 716;"W1"    ! Output voltage from pA meter        160E
9950      WAIT Time-1
9960          ENTER 716;I1,V     ! Transfer to 9826                    160F
9970          IF I1<0 THEN GOTO 9960
9980      WAIT 1
9990          ENTER 716;I2,V
10000         IF I2<0 THEN GOTO 9990
10010     WAIT 1
10020         ENTER 716;I3,V
10030         IF I3<0 THEN GOTO 10020
10040         !
10050         I=(I1+I2+I3)/3           ! Current reading is mean of three
10060         !
10070         OUTPUT 716;"W7"          ! Return pA meter voltage to zero
10080     WAIT 1
10090     ! Discharge..........
10100         OUTPUT 723;"OB 15 4,1T"  ! Close relay to 100k ohm resistor
10110     WAIT 1
10120         OUTPUT 723;"OB 15 4,0T"  ! Open relay to 100k ohm resistor
10130     !
10140     IF W=0 THEN GOTO 10180
10150     IF W<16*Load_no/Adapter1 THEN GOTO 10180
10160     IF W<32*Load_no/Adapter1 THEN GOTO 10200
10170     IF W<48*Load_no/Adapter1 THEN GOTO 10220
10180     OUTPUT 723;"OB 12",K,"0T"        ! Open sample 1-16 relay
```

```
10190              GOTO 10240
10200       OUTPUT 723;"OB 13",K,"0T"       ! Open sample 17-32 relay
10210              GOTO 10240
10220       OUTPUT 723;"OB 14",K,"0T"       ! Open sample 33-48 relay
10230       !
10240       W=W+1            ! Number next sample..................
10250       GOSUB Calc_ir
10260       IF W=Sample_no THEN RETURN
10270          NEXT K
10280          GOSUB Discharge            ! To reduce diel. abs. effects
10290       IF W=16*Load_no/Adapter1 OR W=32*Load_no/Adapter1 THEN GOTO 9740
10300          RETURN
10310 !
10320 Bertan:                 ! To use the Bertan as voltage source
10330                   REMOTE 716                                          160C
10340                   OUTPUT 716;"F1RA1I3T1L2"
10350                   WAIT 1
10360         OUTPUT 723;"OB 15 6,0T"   ! Open va relay from 4140B          160G
10370         OUTPUT 716;"A6"           ! 4140B voltage source off
10380         OUTPUT 723;"OB 15 3, 1T"  ! Close relay to Bertan
10390         OUTPUT 723;"OB 15 1, 1T"  ! Close pA current measuring relay
10400         OUTPUT 723;"OB 15 2,1T"   ! High voltage light on
10410    Volt_bert=Voltage/.0151        ! Adjustment factor for Bertan
10420    !
10430    FOR K=0 TO 15 STEP Adapter1
10440    ! Bring pA meter to zero
10450         OUTPUT 723;"OB 15 1, 0T" ! Open pA current measuring relay
10460      WAIT 7
10470         OUTPUT 716;"Z"            ! Zero pA meter (i.e. blank value)
10480         OUTPUT 723;"OB 15 1, 1T" ! Close pA current measuring relay
10490    !
10500    IF W=0 THEN GOTO 10550
10510    IF W<16*Load_no/Adapter1 THEN GOTO 10550
10520    IF W<32*Load_no/Adapter1 THEN GOTO 10570
10530    IF W<48*Load_no/Adapter1 THEN GOTO 10590
10540    !
10550            OUTPUT 723;"OB 12",K,"1T" ! Close sample 1-16 relay
10560      GOTO 10600
10570            OUTPUT 723;"OB 13",K,"1T" ! Close sample 17-32 relay
10580      GOTO 10600
10590            OUTPUT 723;"OB 14",K,"1T" ! Close sample 33-48 relay
10600      WAIT 1
10610            OUTPUT 723;"OP 6",Volt_bert,"T"  ! Set voltage on Bertan
10620      WAIT Time-1
10630            ENTER 716;I1,V                   ! Transfer to 9826
10640            IF I1<0 THEN GOTO 10630
10650      WAIT 1
10660            ENTER 716;I2,V
10670            IF I2<0 THEN GOTO 10660
10680      WAIT 1
10690            ENTER 716;I3,V
10700            IF I3<0 THEN GOTO 10690
10710            I=(I1+I2+I3)/3
10720    !
10730         OUTPUT 723;"OP 6,0T"      ! Return Bertan voltage to zero
10740      WAIT 5
10750         OUTPUT 723;"OB 15 4,1T"   ! Close relay to 100k ohm resistor
10760      WAIT 1
10770         OUTPUT 723;"OB 15 4,0T"   ! Open relay to 100k ohm resistor
10780    IF W=0 THEN GOTO 10820
10790    IF W<16*Load_no/Adapter1 THEN GOTO 10820
10800    IF W<32*Load_no/Adapter1 THEN GOTO 10840
10810    IF W<48*Load_no/Adapter1 THEN GOTO 10860
10820            OUTPUT 723;"OB 12",K,"0T"! Open sample 1-16 relay
10830      GOTO 10870
```

```
10840                OUTPUT 723;"OB 13",K,"OT"! Open sample 17-32 relay
10850      GOTO 10870
10860                OUTPUT 723;"OB 14",K,"OT"! Open sample 33-48 relay
10870      W=W+1
10880        GOSUB Calc_ir
10890     IF W=Sample_no THEN RETURN
10900     NEXT K
10910     GOSUB Discharge
10920     IF W=16*Load_no/Adapter1 OR W=32*Load_no/Adapter1 THEN GOTO 10430
10930     RETURN
10940!
10950 Calc_ir:              !
10960       Resist(W)=INT(Voltage/I)/10^6
10970         !
10980 ! To avoid exceeding image with opens
10990       IF Resist(W)>9999999 THEN Resist(W)=9999999
11000         !
11010       GOSUB Display1           ! Display Cap/Df/uncorrected I.R.
11020         !
11030              Fact_temp=1
11040      IF Temp_cor=1 THEN GOSUB Temperature
11050!
11060      Resist(W)=INT(Resist(W)/Fact_temp)
11070      IF Times=1 THEN Data(W,3)=Resist(W)
11080      IF Times=2 THEN Data(W,4)=Resist(W)
11090      IF Times=3 THEN Data(W,5)=Resist(W)
11100      IF Times=4 THEN Data(W,6)=Resist(W)
11110      RETURN
11120!
11130 Display1:           !
11140      OUTPUT 1 USING "1DDD,#";W
11150      OUTPUT 1 USING "5DDD.DDDD,#";Data(W,1)
11160      OUTPUT 1 USING "5DD.DD,#";Data(W,2)
11170      OUTPUT 1 USING "9DDDDDDDD,#";DROUND(INT(Data(W,1)*Resist(W)),4)
11180      OUTPUT 1 USING "6DDD";Voltage
11190       RETURN
11200!
11210!
11220 Temperature:         !
11230!
11240                  Fluke1=0
11250                  Fluke2=0
11260      OUTPUT 723;"IP 2T"                  ! Trigger Fluke
11270      ENTER 72301;Fluke1                  ! Take reading
11280    WAIT .5
11290      OUTPUT 723;"IP 2T"                  ! Re-trigger Fluke
11300      ENTER 72301;Fluke2                  ! Take 2nd reading
11310    IF Fluke1=Fluke2 THEN 11330           ! Ok if two readings are the same
11320       GOTO 11240                         ! If not the same, repeat reading
11330       ! Convert Fluke reading to centigrade
11340       A=0
11350       B=0
11360       B1=0
11370       C=0
11380       T=0
11390    A=INT(Fluke1/256)
11400    B=Fluke1-(A*256)
11410    C=(B-(INT(B/16)*16))/10
11420    B1=INT(B/16)
11430    Temp(W)=A*10+B1+C
11440         !
11450           IF Temp(W)<20 OR Temp(W)>30 THEN GOSUB Error_temp
11460           IF Temp(W)=20 OR Temp(W)<20.5 THEN GOTO 11590
11470           IF Temp(W)=20.5 OR Temp(W)<21.5 THEN GOTO 11610
11480           IF Temp(W)=21.5 OR Temp(W)<22.5 THEN GOTO 11630
```

```
11490          IF Temp(W)=22.5 OR Temp(W)<23.5 THEN GOTO 11650
11500          IF Temp(W)=23.5 OR Temp(W)<24.5 THEN GOTO 11670
11510          IF Temp(W)=24.5 OR Temp(W)<25.5 THEN GOTO 11690
11520          IF Temp(W)=25.5 OR Temp(W)<26.5 THEN GOTO 11710
11530          IF Temp(W)=26.5 OR Temp(W)<27.5 THEN GOTO 11730
11540          IF Temp(W)=27.5 OR Temp(W)<28.5 THEN GOTO 11750
11550          IF Temp(W)=28.5 OR Temp(W)<29.5 THEN GOTO 11770
11560          IF Temp(W)=29.5 OR Temp(W)<30 THEN GOTO 11790
11570          IF Temp(W)=30 THEN Fact_temp=.71
11580          RETURN
11590                   Fact_temp=1.42
11600                   RETURN
11610                   Fact_temp=1.33
11620                   RETURN
11630                   Fact_temp=1.24
11640                   RETURN
11650                   Fact_temp=1.16
11660                   RETURN
11670                   Fact_temp=1.08
11680                   RETURN
11690                   Fact_temp=1
11700                   RETURN
11710                   Fact_temp=.94
11720                   RETURN
11730                   Fact_temp=.87
11740                   RETURN
11750                   Fact_temp=.82
11760                   RETURN
11770                   Fact_temp=.76
11780                   RETURN
11790                   Fact_temp=.71
11800                   RETURN
11810 !
11820 Error_temp: OUTPUT 1 USING "@"
11830           OUTPUT 1;""
11840           OUTPUT 1;"MEASURING TEMPERATURE IS OUT OF LIMITS !"
11850           SUBEXIT
11860 !
11870 Discharge:      !
11880      OUTPUT 723;"OB 15 4,1T"       ! Close relay to 100K ohm resistor
11890           FOR J=0 TO 15 STEP Adapter1
11900      OUTPUT 723;"OB 12",J,"1T"     ! Close sample 1-16 relay
11910           WAIT .5
11920      OUTPUT 723;"OB 12",J,"0T"     ! Open sample 1-16 relay
11930           !
11940      OUTPUT 723;"OB 13",J,"1T"     ! Close sample 17-32 relay
11950           WAIT .5
11960      OUTPUT 723;"OB 13",J,"0T"     ! Open sample 17-32 relay
11970           !
11980      OUTPUT 723;"OB 14",J,"1T"     ! Close sample 33-48 relay
11990           WAIT .5
12000      OUTPUT 723;"OB 14",J,"0T"     ! Open sample 33-48 relay
12010           NEXT J
12020           !
12030           OUTPUT 723;"OB 15 4,0T"  ! Open relay to 100K ohm resistor
12040           !
12050 RETURN
12060 !
12070  SUBEXIT
12080 !
12090  SUBEND    !_____
12100 !*****************************************
12110 SUB Calc        !
12120!******************************************
```

```
12130 COM /Condns/ Sample_no,Voltage_no, Voltage,Voltage1,Voltage2, Voltage3,
      Voltage4,Adapter1,Temp_cor,Time,Hz,Test_temp,Bottom1,Cap1,Df1
12140 COM /Data/ Data(103,6),Z,W
12150 COM /Counters/ Zero_no,Load_no,Times,Plots
12160 COM /Interim/ Cap(96),Df(96),Temp(96),Resist(103)
12170 COM /Ok/ Cap_ok
12180 !
12190    DISP
12200    !
12210           ! Sample_no+1= minimum value
12220           ! Sample_no+2= maximum value
12230           ! Sample_no+3= uncorrected mean
12240           ! Sample_no+4= corrected mean
12250           ! ResistX(100) are insulation resistance
12260           ! Sample_no+5= corrected sigma
12270           ! ResistX(101) are insulation resistances
12280           ! Cap1=tolerance for Cap reject
12290           ! Df1= Max value for Df reject
12300    IF Sample_no=1 THEN GOSUB Single
12310 GOSUB Capacitance
12320 !
12330 GOSUB Df
12340 !
12350 GOSUB In_resist
12360 !
12370 GOSUB End
12380 !
12390 Single:        !
12400                Data(Sample_no+3,1)=Data(1,1)
12410                Data(Sample_no+4,1)=Data(1,1)
12420                GOSUB End
12430 End:           !
12440                SUBEXIT
12450                RETURN
12460 Capacitance:                            !
12470      Data(Sample_no+1,1)=Data(1,1)
12480      Data(Sample_no+2,1)=Data(1,1)
12490      Number=0
12500      Cap_ok=0
12510      !
12520 FOR K=1 TO Sample_no
12530      IF Data(K,1)<=0 THEN GOTO 12560            ! Exclude zero values
12540      Data(Sample_no+3,1)=Data(Sample_no+3,1)+Data(K,1)                          !
      Sum
12550      Number=Number+1
12560 NEXT K
12570      Data(Sample_no+3,1)=Data(Sample_no+3,1)/Number                             !
      Gross Mean excluding zeros
12580      !
12590 FOR K=1 TO Sample_no    ! Do not include cap + df rejects
12600      IF Data(K,1)<Data(Sample_no+3,1)*(1-Cap1) OR
      Data(K,1)>Data(Sample_no+3,1)*(1+Cap1) THEN GOTO 12660
12610      IF Data(K,2)>Df1 OR Data(K,2)<=0 THEN GOTO 12660
12620      IF Data(K,1)<Data(Sample_no+1,1) THEN Data(Sample_no+1,1)=Data(K,1)
12630      IF Data(K,1)>Data(Sample_no+2,1) THEN Data(Sample_no+2,1)=Data(K,1)
12640      Data(Sample_no+4,1)=Data(Sample_no+4,1)+Data(K,1)
12650      Cap_ok=Cap_ok+1                    ! Number of non-reject units
12660 NEXT K
12670 IF Cap_ok=0 THEN GOTO 12790
12680      Data(Sample_no+4,1)=Data(Sample_no+4,1)/Cap_ok   ! Corrected mean
12690      !
12700    !. Sigma
12710    IF Cap_ok<=1 THEN GOTO 12790
12720 FOR K=1 TO Sample_no
```

```
12730        IF Data(K,1)<Data(Sample_no+3,1)*(1-Cap1) OR
     Data(K,1)>Data(Sample_no+3,1)*(1+Cap1) THEN GOTO 12760
12740        IF Data(K,2)>Df1 OR Data(K,2)=0 THEN GOTO 12760
12750           Data(Sample_no+5,1)=Data(Sample_no+5,1)+(Data(K,1)-
     Data(Sample_no+4,1))^2
12760  NEXT K
12770           Data(Sample_no+5,1)=SQR(Data(Sample_no+5,1)/(Cap_ok-1))     !
     1 sigma
12780           Data(Sample_no+5,1)=ABS(Data(Sample_no+5,1))
12790  RETURN
12800           !
12810 Df:           ! Do not include cap and df rejects
12820           Data(Sample_no+1,2)=Data(1,2)
12830           Data(Sample_no+2,2)=Data(1,2)
12840           Df_ok=0
12850  FOR K=1 TO Sample_no
12860           Data(Sample_no+3,2)=Data(Sample_no+3,2)+Data(K,2)
12870           IF Data(K,1)<Data(Sample_no+3,1)*(1-Cap1) OR Data(K,1)>Data
     (Sample_no+3,1)*(1+Cap1) THEN GOTO 12930
12880           IF Data(K,2)>Df1 OR Data(K,2)=0 THEN GOTO 12930
12890           IF Data(K,2)<Data(Sample_no+1,2) THEN Data(Sample_no+1,2) =
     Data(K,2)
12900           IF Data(K,2)>Data(Sample_no+2,2) THEN Data(Sample_no+2,2)=
     Data(K,2)
12910           Data(Sample_no+4,2)=Data(Sample_no+4,2)+Data(K,2)
12920           Df_ok=Df_ok+1
12930  NEXT K
12940   ! Means
12950           Data(Sample_no+3,2)=Data(Sample_no+3,2)/Sample_no    ! Gross mean
12960           IF Df_ok=0 THEN GOTO 13090
12970           Data(Sample_no+4,2)=Data(Sample_no+4,2)/Df_ok    ! Corrected mean
12980           !
12990   ! Sigma
13000  FOR K=1 TO Sample_no
13010  IF Df_ok<=1 THEN GOTO 13090
13020           IF Data(K,1)<Data(Sample_no+3,1)*(1-Cap1) OR Data(K,1)>Data
     (Sample_no+3,1)*(1+Cap1) THEN GOTO 13050
13030           IF Data(K,2)>Df1 OR Data(K,2)=0 THEN GOTO 13050
13040           Data(Sample_no+5,2)=Data(Sample_no+5,2)+(Data(K,2)-
     Data(Sample_no+4,2))^2
13050  NEXT K
13060           Data(Sample_no+5,2)=SQR(Data(Sample_no+5,2)/(Df_ok-1))   ! Corrected
     sigma
13070           Data(Sample_no+5,2)=ABS(Data(Sample_no+5,2))
13080           !
13090  RETURN
13100  !
13110 In_resist:       !
13120        IF Voltage1>0 THEN GOSUB Ir1
13130        IF Voltage2>0 THEN GOSUB Ir2
13140        IF Voltage3>0 THEN GOSUB Ir3
13150        IF Voltage4>0 THEN GOSUB Ir4
13160        RETURN
13170 Ir1:             ! Do not include units reject for cap or df
13180             Data(Sample_no+1,3)=Data(1,3)*Data(1,1)
13190             Data(Sample_no+2,3)=Data(1,3)*Data(1,1)
13200             !
13210        FOR K=1 TO Sample_no
13220             Data(Sample_no+3,3)=Data(Sample_no+3,3)+Data(K,3)
13230             IF Data(K,1)<Data(Sample_no+3,1)*(1-Cap1) OR
     Data(K,1)>Data(Sample_no+3,1)*(1+Cap1) THEN GOTO 13290
13240             IF Data(K,2)=0 OR Data(K,2)>Df1 THEN GOTO 13290
13250             IF Data(K,3)*Data(K,1)<Data(Sample_no+1,3) THEN
     Data(Sample_no+1,3)=Data(K,3)*Data(K,1)
```

```
13260                    IF Data(K,3)*Data(K,1)>Data(Sample_no+2,3) THEN
       Data(Sample_no+2,3)=Data(K,3)*Data(K,1)
13270
       Data(Sample_no+4,3)=Data(Sample_no+4,3)+(Data(K,3)*Data(K,1))
13280                    R1_ok=R1_ok+1
13290           NEXT K
13300   ! Means
13310                    Data(Sample_no+3,3)=Data(Sample_no+3,3)/Sample_no
13320       IF R1_ok=0 THEN RETURN
13330                    Data(Sample_no+4,3)=Data(Sample_no+4,3)/R1_ok
13340   !
13350   ! Sigma
13360   IF R1_ok<=1 THEN RETURN
13370          FOR K=1 TO Sample_no
13380                    IF Data(K,1)<Data(Sample_no+3,1)*(1-Cap1) OR
       Data(K,1)>Data(Sample_no+3,1)*(1+Cap1) THEN GOTO 13410
13390                    IF Data(K,2)=0 OR Data(K,2)>Df1 THEN GOTO 13410
13400
       Data(Sample_no+5,3)=Data(Sample_no+5,3)+((Data(K,3)*Data(K,1))-
       Data(Sample_no+4,3))^2
13410          NEXT K
13420                    Data(Sample_no+5,3)=SQR(Data(Sample_no+5,3)/(R1_ok-1))
13430                    Data(Sample_no+5,3)=ABS(Data(Sample_no+5,3))
13440                    !
13450          RETURN
13460                    !
13470  Ir2:              ! Do not include units reject for cap or df
13480                    Data(Sample_no+1,4)=Data(1,4)*Data(1,1)
13490                    Data(Sample_no+2,4)=Data(1,4)*Data(1,1)
13500       FOR K=1 TO Sample_no
13510                    Data(Sample_no+3,4)=Data(Sample_no+3,4)+Data(K,4)
13520                    IF Data(K,1)<Data(Sample_no+3,1)*(1-Cap1) OR
       Data(K,1)>Data(Sample_no+3,1)*(1+Cap1) THEN GOTO 13580
13530                    IF Data(K,2)=0 OR Data(K,2)>Df1 THEN GOTO 13580
13540                    IF Data(K,4)*Data(K,1)<Data(Sample_no+1,4) THEN
       Data(Sample_no+1,4)=Data(K,4)*Data(K,1)
13550                    IF Data(K,4)*Data(K,1)>Data(Sample_no+2,4) THEN
       Data(Sample_no+2,4)=Data(K,4)*Data(K,1)
13560
       Data(Sample_no+4,4)=Data(Sample_no+4,4)+(Data(K,4)*Data(K,1))
13570                    R2_ok=R2_ok+1
13580          NEXT K
13590   ! Means
13600                    Data(Sample_no+3,4)=Data(Sample_no+3,4)/Sample_no
13610       IF R2_ok=0 THEN RETURN
13620                    Data(Sample_no+4,4)=Data(Sample_no+4,4)/R2_ok
13630                    !
13640   ! Sigma
13650   IF R2_ok<=1 THEN RETURN
13660          FOR K=1 TO Sample_no
13670                    IF Data(K,1)<Data(Sample_no+3,1)*(1-Cap1) OR Data(K,1)>Data
       (Sample_no+3,1)*(1+Cap1) THEN GOTO 13700
13680                    IF Data(K,2)=0 OR Data(K,2)>Df1 THEN GOTO 13700
13690  Data(Sample_no+5,4)=Data(Sample_no+5,4)+((Data(K,4)*Data(K,1))-
       Data(Sample_no+4,4))^2
13700          NEXT K
13710                    Data(Sample_no+5,4)=SQR(Data(Sample_no+5,4)/(R2_ok-1))
13720                    Data(Sample_no+5,4)=ABS(Data(Sample_no+5,4))
13730          RETURN
13740                    !
13750  Ir3:              ! Do not include units reject for cap or df
13760                    Data(Sample_no+1,5)=Data(1,5)*Data(1,1)
13770                    Data(Sample_no+2,5)=Data(1,5)*Data(1,1)
13780                    !
13790          FOR K=1 TO Sample_no
```

```
13800                  Data(Sample_no+3,5)=Data(Sample_no+3,5)+Data(K,5)
13810                  IF Data(K,1)<Data(Sample_no+3,1)*(1-Cap1) OR
       Data(K,1)>Data(Sample_no+3,1)*(1+Cap1) THEN GOTO 13870
13820                    IF Data(K,2)=0 OR Data(K,2)>Df1 THEN GOTO 13870
13830                      IF Data(K,5)*Data(K,1)<Data(Sample_no+1,5) THEN
       Data(Sample_no+1,5)=Data(K,5)*Data(K,1)
13840                      IF Data(K,5)*Data(K,1)>Data(Sample_no+2,5) THEN
       Data(Sample_no+2,5)=Data(K,5)*Data(K,1)
13850       Data(Sample_no+4,5)=Data(Sample_no+4,5)+(Data(K,5)*Data(K,1))
13860                      R3_ok=R3_ok+1
13870            NEXT K
13880   ! Means
13890                  Data(Sample_no+3,5)=Data(Sample_no+3,5)/Sample_no
13900     IF R3_ok=0 THEN RETURN
13910                  Data(Sample_no+4,5)=Data(Sample_no+4,5)/R3_ok
13920   ! Sigma
13930   IF R3_ok<=1 THEN RETURN
13940         FOR K=1 TO Sample_no
13950              IF Data(K,1)<Data(Sample_no+3,1)*(1-Cap1) OR Data(K,1)>
       Data(Sample_no+3,1)*(1+Cap1) THEN GOTO 13980
13960              IF Data(K,2)=0 OR Data(K,2)>Df1 THEN GOTO 13980
13970   Data(Sample_no+5,5)=Data(Sample_no+5,5)+((Data(K,5)*Data(K,1))-
       Data(Sample_no+4,5))^2
13980            NEXT K
13990                  Data(Sample_no+5,5)=SQR(Data(Sample_no+5,5)/(R3_ok-1))
14000                  Data(Sample_no+5,5)=ABS(Data(Sample_no+5,5))
14010                  !
14020            RETURN
14030                  !
14040 Ir4:             ! Do not include units reject for cap or df
14050                  Data(Sample_no+1,6)=Data(1,6)*Data(1,1)
14060                  Data(Sample_no+2,6)=Data(1,6)*Data(1,1)
14070                  !
14080          FOR K=1 TO Sample_no
14090                  Data(Sample_no+3,6)=Data(Sample_no+3,6)+Data(K,6)
14100                  IF Data(K,1)<Data(Sample_no+3,1)*(1-Cap1) OR
       Data(K,1)>Data(Sample_no+3,1)*(1+Cap1) THEN GOTO 14160
14110                  IF Data(K,2)=0 OR Data(K,2)>Df1 THEN GOTO 14160
14120                  IF Data(K,6)*Data(K,1)<Data(Sample_no+1,6) THEN
       Data(Sample_no+1,6)=Data(K,6)*Data(K,1)
14130                  IF Data(K,6)*Data(K,1)>Data(Sample_no+2,6) THEN
       Data(Sample_no+2,6)=Data(K,6)*Data(K,1)
14140    Data(Sample_no+4,6)=Data(Sample_no+4,6)+(Data(K,6)*Data(K,1))
14150                  R4_ok=R4_ok+1
14160            NEXT K
14170   ! Means
14180                  Data(Sample_no+3,6)=Data(Sample_no+3,6)/Sample_no
14190       IF R4_ok=0 THEN RETURN
14200                  Data(Sample_no+4,6)=Data(Sample_no+4,6)/R4_ok
14210   ! Sigma
14220       IF R4_ok<=1 THEN RETURN
14230            FOR K=1 TO Sample_no
14240                  IF Data(K,1)<Data(Sample_no+3,1)*(1-Cap1) OR
       Data(K,1)>Data(Sample_no+3,1)*(1+Cap1) THEN GOTO 14270
14250                  IF Data(K,2)=0 OR Data(K,2)>Df1 THEN GOTO 14270
14260   Data(Sample_no+5,6)=Data(Sample_no+5,6)+((Data(K,6)*Data(K,1))-
       Data(Sample_no+4,6))^2
14270            NEXT K
14280                  Data(Sample_no+5,6)=SQR(Data(Sample_no+5,6)/(R4_ok-1))
14290                  Data(Sample_no+5,6)=ABS(Data(Sample_no+5,6))
14300            RETURN
14310                  !
14320         SUBEND
14330 !*****************************************
14340 SUB Table
```

```
14350 !*******************************************
14360 COM /Info/
      Job_no$[20],Sample$[80],Remarks$[80],Operator$[20],Type$[30],Test_date$[2
      0],File$
14370 COM /Condns/
      Sample_no,Voltage_no,Voltage,Voltage1,Voltage2,Voltage3,Voltage4,Adapter1
      ,Temp_cor,Time,Hz,Test_temp,Bottom1,Cap1,Df1
14380 COM /Data/ Data(103,6),Z,W
14390 COM /Counters/ Zero_no,Load_no,Times,Plots
14400 !
14410 PRINTER IS 701
14420    PRINT CHR$(12);                      ! Clear alpha
14430 PRINT ""
14440 PRINT TAB(20);"**** DUPONT CAPACITOR CHARACTERIZATION ****"
14450 PRINT ""
14460 PRINT TAB(5);"JOB NUMBER:  ";Job_no$
14470 PRINT ""
14480 PRINT TAB(5);"SAMPLE DESCRIPTION:  ";Sample$
14490 PRINT ""
14500 PRINT TAB(5);"REMARKS:  ";Remarks$
14510 PRINT ""
14520 Test_date$=DATE$(TIMEDATE)
14530 PRINT TAB(5);"OPERATOR:  ";Operator$;TAB(50);"DATE:  ";Test_date$
14540 PRINT ""
14550 PRINT TAB(5);"TEST CONDITIONS:  "
14560          Test_temp=INT(Test_temp*10)
14570          Test_temp=Test_temp/10
14580 PRINT TAB(16);"Mean test temperature  : ";Test_temp;" C."
14590 PRINT TAB(16);"Frequency for cap & df : ";Hz;"  Hz"
14600 IF Voltage_no=0 THEN GOTO 14640
14610 PRINT TAB(16);"Time for Insul.Resist. : ";Time;" Seconds"
14620 IF Temp_cor=0 THEN GOTO 14640
14630 PRINT TAB(16);"I.R. values adjusted to 25 C. (EIA RS-377)"
14640 PRINT ""
14650 IF File$="0" THEN GOTO 14700
14660 Test_time$=TIME$(TIMEDATE)
14670 File$=Test_date$[1,2]&Test_date$[4,6]&Test_time$[1,2]&Test_time$[4,5]
14680 PRINT "Data Stored in File : ";File$
14690 PRINT ""
14700 PRINT "........................................................................"
14710 IF Temp_cor=0 THEN GOTO 14740
14720 PRINT TAB(2);"SAMPLE";TAB(12);"CAPACITANCE";TAB(25);" D.F."; TAB(35);
      "INSULATION RESISTANCE @ 25 C. ,megohm-uf"
14730 GOTO 14750
14740 PRINT TAB(2);"SAMPLE";TAB(12);"CAPACITANCE";TAB(25);" D.F."; TAB(35);
      "INSULATION RESISTANCE, megohm-uf"
14750          ! Convert for low capacitance units
14760    IF Data(Sample_no+4,1)>.01 THEN GOTO 14920
14770 IF Voltage_no=4 THEN GOTO 14830
14780 IF Voltage_no=3 THEN GOTO 14850
14790 IF Voltage_no=2 THEN GOTO 14870
14800 IF Voltage_no=1 THEN GOTO 14890
14810 IF Voltage_no=0 THEN GOTO 14890
14820 !
14830 PRINT TAB(2);"NO.";TAB(12); "nanofarad";TAB(26);"%"; TAB(38);Voltage1; "v";
      TAB(49); Voltage2;"v"; TAB(61); Voltage3;"v";TAB(72);Voltage4;"v"
14840 GOTO 15040
14850 PRINT TAB(2);"NO.";TAB(12);"nanofarad"; TAB(26);"%";TAB(41); Voltage1; "v";
      TAB(56); Voltage2;"v";TAB(71);Voltage3;"v"
14860 GOTO 15040
14870 PRINT TAB(2);"NO.";TAB(12);"nanofarad"; TAB(26);"%"; TAB(43);Voltage1;
      "volts";TAB(62);Voltage2;"volts"
14880 GOTO 15040
14890 PRINT TAB(2); "NO.";TAB(12); "nanofarad";TAB(26); "%";TAB(47);
      Voltage1;"volts"
```

```
14900 GOTO 15040
14910 !
14920 IF Voltage_no=4 THEN GOTO 14970
14930 IF Voltage_no=3 THEN GOTO 14990
14940 IF Voltage_no=2 THEN GOTO 15010
14950 IF Voltage_no=1 THEN GOTO 15030
14960 IF Voltage_no=0 THEN GOTO 15030
14970 PRINT TAB(2);"NO."; TAB(12);"microfarad"; TAB(26);"%";TAB(38);Voltage1;
      "v";TAB(49);Voltage2;"v";TAB(61);Voltage3;"v";TAB(72);Voltage4;"v"
14980 GOTO 15040
14990 PRINT TAB(2);"NO."; TAB(12);"microfarad";TAB(26); "%";TAB(41);
      Voltage1;"v"; TAB(56); Voltage2;"v";TAB(71);Voltage3;"v"
15000 GOTO 15040
15010 PRINT TAB(2);"NO."; TAB(12);"microfarad"; TAB(26);"%"; TAB(43); Voltage1;
      "volts";TAB(62);Voltage2;"volts"
15020 GOTO 15040
15030 PRINT TAB(2);"NO."; TAB(12);"microfarad"; TAB(26); "%";TAB(47); Voltage1;
      "volts"
15040 PRINT "............................................................................"
15050 PRINT ""
15060 SUBEND
15070 !*******************************************
15080 SUB Columns
15090 !*******************************************
15100 !
15110   COM /Condns/ #Sample_no,Voltage_no, Voltage,Voltage1,Voltage2, Voltage3,
      Voltage4,Adapter1,Temp_cor,Time,Hz,Test_temp,Bottom1,Cap1,Df1
15120 COM /Data/ Data(103,6),Z,W
15130 COM /Interim/ Cap(96),Df(96),Temp(96),Resist(103)
15140 !
15150 IF Voltage_no=4 THEN GOSUB Four
15160 IF Voltage_no=3 THEN GOSUB Three
15170 IF Voltage_no=2 THEN GOSUB Two
15180 IF Voltage_no=1 THEN GOSUB One
15190 IF Voltage_no=0 THEN GOSUB None
15200 !
15210 IF Sample_no=1 THEN GOTO 15250
15220 !
15230 GOSUB Means
15240 GOSUB Bottom
15250 SUBEXIT
15260 Four:  !
15270        FOR K=1 TO Sample_no
15280        IF Data(K,1)<Data(Sample_no+4,1)*(1-Cap1) OR Data(K,1)>Data
      (Sample_no+4,1)*(1+Cap1) THEN GOTO 15310
15290        IF Data(K,2)=0 OR Data(K,2)>Df1 THEN GOTO 15310
15300        GOTO 15350
15310   PRINT USING "1A,#";"*"
15320   PRINT USING "3DD,#";K
15330   Bottom1=1
15340        GOTO 15360
15350   PRINT USING "4DD,#";K
15360        IF Data(Sample_no+4,1)>.01 THEN GOTO 15390
15370   PRINT USING "7DDD.DDDD,#";Data(K,1)*1000
15380        GOTO 15400
15390   PRINT USING "7DDD.DDDD,#";Data(K,1)
15400   PRINT USING "6DD.DD,#";Data(K,2)
15410   PRINT USING "7DDDDDDD,#";DROUND((Data(K,3)*Data(K,1)),4)
15420   PRINT USING "5DDDDDDD,#";DROUND((Data(K,4)*Data(K,1)),4)
15430   PRINT USING "6DDDDDDD,#";DROUND((Data(K,5)*Data(K,1)),4)
15440   PRINT USING "5DDDDDDD";DROUND((Data(K,6)*Data(K,1)),4)
15450        NEXT K
15460        RETURN
15470 Three:      !
15480        FOR K=1 TO Sample_no
```

```
15490       IF Data(K,1)<Data(Sample_no+4,1)*(1-Cap1) OR Data(K,1)>Data
            (Sample_no+4,1)*(1+Cap1) THEN GOTO 15520
15500       IF Data(K,2)=0 OR Data(K,2)>Df1 THEN GOTO 15520
15510       GOTO 15560
15520  PRINT USING "1A,#";"*"
15530  PRINT USING "3DD,#";K
15540  Bottom1=1
15550       GOTO 15570
15560  PRINT USING "4DD,#";K
15570       IF Data(Sample_no+4,1)>.01 THEN GOTO 15600
15580  PRINT USING "7DDD.DDDD,#";Data(K,1)*1000
15590       GOTO 15610
15600  PRINT USING "7DDD.DDDD,#";Data(K,1)
15610  PRINT USING "6DD.DD,#";Data(K,2)
15620  PRINT USING "10DDDDDDD,#";DROUND((Data(K,3)*Data(K,1)),4)
15630  PRINT USING "9DDDDDDD,#";DROUND((Data(K,4)*Data(K,1)),4)
15640  PRINT USING "9DDDDDDD";DROUND((Data(K,5)*Data(K,1)),4)
15650       NEXT K
15660       RETURN
15670 Two:            !
15680       FOR K=1 TO Sample_no
15690       IF Data(K,1)<Data(Sample_no+4,1)*(1-Cap1) OR Data(K,1)>Data
            (Sample_no+4,1)*(1+Cap1) THEN GOTO 15720
15700       IF Data(K,2)=0 OR Data(K,2)>Df1 THEN GOTO 15720
15710       GOTO 15760
15720  PRINT USING "1A,#";"*"
15730  PRINT USING "3DD,#";K
15740  Bottom1=1
15750       GOTO 15770
15760  PRINT USING "4DD,#";K
15770       IF Data(Sample_no+4,1)>.01 THEN GOTO 15800
15780  PRINT USING "7DDD.DDDD,#";Data(K,1)*1000
15790       GOTO 15810
15800  PRINT USING "7DDD.DDDD,#";Data(K,1)
15810  PRINT USING "6DD.DD,#";Data(K,2)
15820  PRINT USING "16DDDDDDD,#";DROUND((Data(K,3)*Data(K,1)),4)
15830  PRINT USING "13DDDDDDD";DROUND((Data(K,4)*Data(K,1)),4)
15840       NEXT K
15850       RETURN
15860 One:            !
15870       FOR K=1 TO Sample_no
15880       IF Data(K,1)<Data(Sample_no+4,1)*(1-Cap1) OR Data(K,1)>Data
            (Sample_no+4,1)*(1+Cap1) THEN GOTO 15910
15890       IF Data(K,2)=0 OR Data(K,2)>Df1 THEN GOTO 15910
15900       GOTO 15950
15910  PRINT USING "1A,#";"*"
15920  PRINT USING "3DD,#";K
15930  Bottom1=1
15940       GOTO 15960
15950  PRINT USING "4DD,#";K
15960       IF Data(Sample_no+4,1)>.01 THEN GOTO 15990
15970  PRINT USING "7DDD.DDDD,#";Data(K,1)*1000
15980       GOTO 16000
15990  PRINT USING "7DDD.DDDD,#";Data(K,1)
16000  PRINT USING "6DD.DD,#";Data(K,2)
16010  PRINT USING "20DDDDDDD";DROUND((Data(K,3)*Data(K,1)),4)
16020       NEXT K
16030       RETURN
16040 None:           !
16050       FOR K=1 TO Sample_no
16060       IF Data(K,1)<Data(Sample_no+4,1)*(1-Cap1) OR Data(K,1)>Data
            (Sample_no+4,1)*(1+Cap1) THEN GOTO 16090
16070       IF Data(K,2)=0 OR Data(K,2)>Df1 THEN GOTO 16090
16080       GOTO 16130
16090  PRINT USING "1A,#";"*"
```

```
16100     PRINT USING "3DD,#";K
16110     Bottom1=1
16120          GOTO 16140
16130     PRINT USING "4DD,#";K
16140          IF Data(Sample_no+4,1)>.01 THEN GOTO 16170
16150     PRINT USING "7DDD.DDDD,#";Data(K,1)*1000
16160          GOTO 16180
16170     PRINT USING "7DDD.DDDD,#";Data(K,1)
16180     PRINT USING "6DD.DD";Data(K,2)
16190          NEXT K
16200          RETURN
16210 Means:            !
16220          IF Voltage_no=4 THEN GOSUB Means4
16230          IF Voltage_no=3 THEN GOSUB Means3
16240          IF Voltage_no=2 THEN GOSUB Means2
16250          IF Voltage_no=1 THEN GOSUB Means1
16260          IF Voltage_no=0 THEN GOSUB Means0
16270          RETURN
16280          !
16290 Means4:           !
16300     PRINT ""
16310     PRINT "Mean values:"
16320          IF Data(Sample_no+4,1)>.01 THEN GOTO 16350
16330     PRINT USING "12DDD.DDDD,#";Data(Sample_no+4,1)*1000
16340          GOTO 16360
16350     PRINT USING "12DDD.DDDD,#";Data(Sample_no+4,1)
16360     PRINT USING "6DD.DD,#";Data(Sample_no+4,2)
16370     PRINT USING "7DDDDDDD,#";DROUND(Data(Sample_no+4,3),4)
16380     PRINT USING "5DDDDDDD,#";DROUND(Data(Sample_no+4,4),4)
16390     PRINT USING "6DDDDDDD,#";DROUND(Data(Sample_no+4,5),4)
16400     PRINT USING "5DDDDDDD";DROUND(Data(Sample_no+4,6),4)
16410     PRINT "Sigma values:"
16420          IF Data(Sample_no+4,1)>.01 THEN GOTO 16450
16430     PRINT USING "12DDD.DDDD,#";Data(Sample_no+5,1)*1000
16440          GOTO 16460
16450     PRINT USING "12DDD.DDDD,#";Data(Sample_no+5,1)
16460     PRINT USING "6DD.DD,#";Data(Sample_no+5,2)
16470     PRINT USING "7DDDDDDD,#";DROUND(Data(Sample_no+5,3),4)
16480     PRINT USING "5DDDDDDD,#";DROUND(Data(Sample_no+5,4),4)
16490     PRINT USING "6DDDDDDD,#";DROUND(Data(Sample_no+5,5),4)
16500     PRINT USING "5DDDDDDD";DROUND(Data(Sample_no+5,6),4)
16510     RETURN
16520 Means3:           !
16530     PRINT ""
16540     PRINT "Mean values:"
16550          IF Data(Sample_no+4,1)>.01 THEN GOTO 16580
16560     PRINT USING "12DDD.DDDD,#";Data(Sample_no+4,1)*1000
16570          GOTO 16590
16580     PRINT USING "12DDD.DDDD,#";Data(Sample_no+4,1)
16590     PRINT USING "6DD.DD,#";Data(Sample_no+4,2)
16600     PRINT USING "10DDDDDDD,#";DROUND(Data(Sample_no+4,3),4)
16610     PRINT USING "9DDDDDDD,#";DROUND(Data(Sample_no+4,4),4)
16620     PRINT USING "9DDDDDDD";DROUND(Data(Sample_no+4,5),4)
16630     PRINT "Sigma values:"
16640          IF Data(Sample_no+4,1)>.01 THEN GOTO 16670
16650     PRINT USING "12DDD.DDDD,#";Data(Sample_no+5,1)*1000
16660          GOTO 16680
16670     PRINT USING "12DDD.DDDD,#";Data(Sample_no+5,1)
16680     PRINT USING "6DD.DD,#";Data(Sample_no+5,2)
16690     PRINT USING "10DDDDDDD,#";DROUND(Data(Sample_no+5,3),4)
16700     PRINT USING "9DDDDDDD,#";DROUND(Data(Sample_no+5,4),4)
16710     PRINT USING "9DDDDDDD";DROUND(Data(Sample_no+5,5),4)
16720     RETURN
16730 Means2:           !
16740     PRINT ""
```

```
16750     PRINT "Mean values:"
16760         IF Data(Sample_no+4,1)>.01 THEN GOTO 16790
16770     PRINT USING "12DDD.DDDD,#";Data(Sample_no+4,1)*1000
16780         GOTO 16800
16790     PRINT USING "12DDD.DDDD,#";Data(Sample_no+4,1)
16800     PRINT USING "6DD.DD,#";Data(Sample_no+4,2)
16810     PRINT USING "16DDDDDDD,#";DROUND(Data(Sample_no+4,3),4)
16820     PRINT USING "13DDDDDDD";DROUND(Data(Sample_no+4,4),4)
16830     PRINT "Sigma values:"
16840         IF Data(Sample_no+4,1)>.01 THEN GOTO 16870
16850     PRINT USING "12DDD.DDDD,#";Data(Sample_no+5,1)*1000
16860         GOTO 16880
16870     PRINT USING "12DDD.DDDD,#";Data(Sample_no+5,1)
16880     PRINT USING "6DD.DD,#";Data(Sample_no+5,2)
16890     PRINT USING "16DDDDDDD,#";DROUND(Data(Sample_no+5,3),4)
16900     PRINT USING "13DDDDDDD";DROUND(Data(Sample_no+5,4),4)
16910     RETURN
16920 Means1:          !
16930     PRINT ""
16940     PRINT "Mean values:"
16950         IF Data(Sample_no+4,1)>.01 THEN GOTO 16980
16960     PRINT USING "12DDD.DDDD,#";Data(Sample_no+4,1)*1000
16970         GOTO 16990
16980     PRINT USING "12DDD.DDDD,#";Data(Sample_no+4,1)
16990     PRINT USING "6DD.DD,#";Data(Sample_no+4,2)
17000     PRINT USING "20DDDDDDD";DROUND(Data(Sample_no+4,3),4)
17010     PRINT "Sigma values:"
17020         IF Data(Sample_no+4,1)>.01 THEN GOTO 17050
17030     PRINT USING "12DDD.DDDD,#";Data(Sample_no+5,1)*1000
17040         GOTO 17060
17050     PRINT USING "12DDD.DDDD,#";Data(Sample_no+5,1)
17060     PRINT USING "6DD.DD,#";Data(Sample_no+5,2)
17070     PRINT USING "20DDDDDDD";DROUND(Data(Sample_no+5,3),4)
17080     RETURN
17090 Means0:          !
17100     PRINT ""
17110     PRINT "Mean values:"
17120         IF Data(Sample_no+4,1)>.01 THEN GOTO 17150
17130     PRINT USING "12DDD.DDDD,#";Data(Sample_no+4,1)*1000
17140         GOTO 17160
17150     PRINT USING "12DDD.DDDD,#";Data(Sample_no+4,1)
17160     PRINT USING "6DD.DD";Data(Sample_no+4,2)
17170     PRINT "Sigma values:"
17180         IF Data(Sample_no+4,1)>.01 THEN GOTO 17210
17190     PRINT USING "12DDD.DDDD,#";Data(Sample_no+5,1)*1000
17200         GOTO 17220
17210     PRINT USING "12DDD.DDDD,#";Data(Sample_no+5,1)
17220     PRINT USING "6DD.DD";Data(Sample_no+5,2)
17230     RETURN
17240 Bottom:          !
17250     PRINT "......................................................................"
17260     IF Bottom1=1 THEN GOTO 17280
17270     RETURN
17280     PRINT "*  Indicates capacitance (>";Cap1*100;"% tolerance) or D.F.
          (>";Df1;"% ) rejects."
17290     PRINT "   Rejects are not included in mean and sigma values."
17300     RETURN
17310     RETURN
17320     SUBEND
17330     !*******************************************
17340     SUB Temp
17350     !*******************************************
17360     COM /Condns/ Sample_no,Voltage_no, Voltage,Voltage1, Voltage2,Voltage3,
          Voltage4,Adapter1,Temp_cor,Time,Hz,Test_temp,Bottom1,Cap1,Df1
17370     COM /Interim/ Cap(96),Df(96),Temp(96),Resist(103)
```

```
17380   !
17390   Fluke1=0
17400   Fluke2=0
17410       OUTPUT 723;"IP 2T"
17420       ENTER 72301;Fluke1
17430       WAIT .5
17440       OUTPUT 723;"IP 2T"
17450       ENTER 72301;Fluke2
17460       IF Fluke1=Fluke2 THEN GOTO 17480
17470       GOTO 17410
17480       A=0
17490       B=0
17500       B1=0
17510       C=0
17520       T=0
17530       A=INT(Fluke1/256)
17540       B=Fluke1-(A*256)
17550       C=(B-(INT(B/16)*16))/10
17560       B1=INT(B/16)
17570       T=A*10+B1+C
17580       IF Test_temp>0 THEN GOTO 17610
17590       Test_temp=T
17600       SUBEXIT
17610       Test_temp=(Test_temp+T)/2
17620       SUBEND
17630 !*************************************************
17640 SUB Plot_cap  !    Histogram of Capacitance
17650 !*************************************************
17660   COM /Info/ Job_no$[20],Sample $[80], Remarks$[80],Operator $[20],
        Type$[30],Test_date$[20],File$[10]
17670   COM /Condns/ Sample_no,Voltage_no,Voltage, Voltage1,Voltage2,
        Voltage3,Voltage4,Adapter1,Temp_cor,Time,Hz,Test_temp,Bottom1,Cap1,Df1
17680 COM /Data/ Data(103,6),Z,W
17690 COM /Interim/ Cap(96),Df(96),Temp(96),Resist(103)
17700   DIM Units$[20]
17710   GINIT
17720   GRAPHICS ON
17730   PRINT CHR$(12);                    ! Clear alpha
17740   GCLEAR
17750   OUTPUT 1 USING "@"
17760       PEN 1
17770   IF Sample_no=1 THEN GOSUB End
17780     GOSUB Inputs
17790     GOSUB X_scale
17800     GOSUB Bin
17810     GOSUB Alpha
17820     GOSUB Outline
17830     GOSUB Label_x
17840     GOSUB Label_y
17850     GOSUB Plot
17860     GOSUB Print
17870     GOSUB End
17880 Inputs:         !
17890                                        DIM B_no(101)
17900                                        FOR K=1 TO 100
17910                                        B_no(K)=0
17920                                        NEXT K
17930                                        RETURN
17940 Alpha:      !
17950   CSIZE 4
17960   MOVE 10,95
17970   LABEL "CAPACITANCE HISTOGRAM"
17980   !
17990   CSIZE 3
18000   MOVE 100,95
```

```
18010    LABEL Test_date$
18020    !
18030    CSIZE 3
18040    MOVE 10,90
18050    LABEL Sample$
18060    !
18070    CSIZE 3
18080    MOVE 15,3
18090    LABEL "CAPACITANCE,";Units$
18100    !
18110    CSIZE 3
18120    MOVE 90,3
18130        Label=Mult*Data(Sample_no+4,1)
18140        Label=DROUND(Label,4)
18150    LABEL "MEAN :";Label
18160    !
18170    CSIZE 3
18180    MOVE 21,7
18190    LABEL "(-20%)"
18200    MOVE 44,7
18210    LABEL "(-10%)"
18220    MOVE 90,7
18230    LABEL "(+10%)"
18240    MOVE 113,7
18250    LABEL "(+20%)"
18260    CSIZE 3
18270    MOVE 2,65
18280        Label$="OCCURENCES"
18290        FOR K=1 TO 10
18300        LABEL Label$[K,K]
18310        NEXT K
18320    RETURN
18330    !
18340 Outline:        !
18350    VIEWPORT 15,130,15,85            ! Define screen area
18360    FRAME
18370    WINDOW Min,Max,0,10*Jig2         ! Set window
18380    ! X tics
18390    AXES (Max-Min)/10,0,Min,0,2,2,5
18400    !    Xtics,Ytics,Xlocation,Ylocation,Xmajor count,Ymajor count,Size
18410    ! Y tics
18420    AXES 0,(10*Jig2)/20,Min,0,10,2,4
18430    !    Xtics,Ytics,Xlocation,Ylocation,Xmajor count,Ymajor count,Size
18440    RETURN
18450 Label_x:                            !
18460 VIEWPORT 0,130,0,100
18470         CSIZE 3
18480         LORG 5
18490         Y=-.5*Jig2
18500         MOVE Min+Space,Y
18510         Label=DROUND(Min+Space,4)
18520         LABEL Label
18530         FOR K=2 TO 8 STEP 2
18540         MOVE Min+Space+(Space*K),Y
18550             Label=Min+Space+(K*Space)
18560             Label=DROUND(Label,4)
18570         LABEL Label
18580         NEXT K
18590     RETURN
18600 !
18610 Label_y:                            !
18620 VIEWPORT 0,130,0,100
18630         CSIZE 3
18640         LORG 5
18650         X=Min-(Space/2)
```

```
18660            Y=Jig2
18670            MOVE X,Y
18680            Label=Jig2
18690            LABEL Label
18700            FOR K=2 TO 9
18710              MOVE X,Y*K
18720              LABEL Label*K
18730            NEXT K
18740 RETURN
18750 !
18760 X_scale:         !
18770                  ! Define units
18780            IF Data(Sample_no+4,1)>100 THEN GOTO 18830
18790            IF Data(Sample_no+4,1)>=.01 THEN GOTO 18850
18800            IF Data(Sample_no+4,1)>=.001 THEN GOTO 18880
18810            IF Data(Sample_no+4,1)<.001 AND Data(Sample_no+4,1)>.000001 THEN
      GOTO 18910
18820              PRINTER IS 701
18830              PRINT "     CAPACITANCE VALUE IS OUT OF RANGE.
      **************************"
18840              GOSUB End
18850              Units$=" Microfarads"
18860              Mult=1
18870              GOTO 18940
18880              Units$=" Nanofarads"
18890              Mult=10^3
18900              GOTO 18940
18910              Units$=" Picofarads"
18920              Mult=10^6
18930              !
18940              Min=Mult*(Data(Sample_no+4,1)-(Data(Sample_no+4,1)*.25))
18950              Max=Mult*(Data(Sample_no+4,1)+(Data(Sample_no+4,1)*.25))
18960              Space=(Max-Min)/10
18970              Jig1=Space/10
18980            RETURN
18990 Bin:         !
19000              !
19010              Buckets=100
19020              B_size=(Max-Min)/Buckets
19030       !
19040            FOR K=1 TO Sample_no
19050              IF Data(K,1)<.75*Data(Sample_no+4,1) THEN GOTO 19080
19060              IF Data(K,1)>1.25*Data(Sample_no+4,1) THEN GOTO 19100
19070              GOTO 19130
19080            Q=1
19090            GOTO 19140
19100            Q=Buckets
19110            GOTO 19140
19120            !
19130            Q=INT(ABS((Mult*Data(K,1))-Min)/B_size)+1 ! Bucket no of value
19140            B_no(Q)=B_no(Q)+1                        ! Number in bucket
19150            NEXT K
19160            !
19170            Max_no=0                                 ! Max in any bucket
19180            FOR K=1 TO Buckets
19190              IF B_no(K)>Max_no THEN Max_no=B_no(K)
19200            NEXT K
19210            !
19220            Jig2=1+INT(Max_no/10)                    ! Determine Y scale
19230            !
19240       RETURN
19250 Plot:    !
19260            VIEWPORT 0,130,0,100
19270       !
19280            X=Min
```

```
19290             Y=0
19300                 MOVE X,Y
19310                 FOR K=1 TO Buckets
19320                 DRAW X,B_no(K)
19330                 X=X+B_size
19340                 Y=Y+(B_no(K)*B_size)
19350                 DRAW X,B_no(K)
19360                 NEXT K
19370             RETURN
19380 Print:        !
19390             DUMP GRAPHICS
19400             RETURN
19410 End:      SUBEND
19420 !*******************************************
19430 SUB Alarm
19440 !*******************************************
19450 !
19460         BEEP 100,.3
19470         WAIT .1
19480         BEEP 200,.3
19490         WAIT .1
19500         BEEP 300,.3
19510         WAIT .1
19520         BEEP 400,.3
19530         WAIT .1
19540         BEEP 500,.3
19550         WAIT .3
19560         BEEP 500,.3
19570         WAIT .1
19580         BEEP 400,.3
19590         WAIT .1
19600         BEEP 300,.3
19610         WAIT .1
19620         BEEP 200,.3
19630         WAIT .1
19640         BEEP 100,.3
19650         WAIT .1
19660         FOR J=1 TO 8
19670         BEEP 500,.3
19680         WAIT .1
19690         NEXT J
19700         !
19710     SUBEND
19720 !*******************************************
19730 SUB Graph_ir    !    Histogram of I.R.
19740 !*******************************************
19750  COM /Info/ Job_no$[20], Sample$[80],Remarks$[80], Operator$[20],
       Type$[30],Test_date$[20],File$[10]
19760  COM /Condns/ Sample_no,Voltage_no, Voltage,Voltage1, Voltage2,Voltage3,
       Voltage4,Adapter1,Temp_cor,Time,Hz,Test_temp,Bottom1,Cap1,Df1
19770 COM /Data/ Data(103,6),Z,W
19780 COM /Counters/ Zero_no,Load_no,Times,Plots
19790 COM /Interim/ Cap(96),Df(96),Temp(96),Resist(103)
19800     DIM B_no (5000)! Large size needed for very wide capacitance range.
19810   GINIT
19820   GRAPHICS ON
19830   PRINTER IS 701
19840   PRINT CHR$(12);                         ! Clear alpha
19850   OUTPUT 1 USING "@"
19860   GCLEAR
19870       PEN 1
19880   IF Sample_no=1 THEN GOSUB End
19890     GOSUB Inputs
19900     GOSUB X_scale
19910     GOSUB Bin
```

```
19920      GOSUB Alpha
19930      GOSUB Outline
19940      GOSUB Label_x
19950      GOSUB Label_y
19960      GOSUB Plot
19970      GOSUB Print
19980      GOSUB End
19990 Inputs:            !                   FOR K=1 TO 500
20000                                        B_no(K)=0
20010                                        NEXT K
20020                                        RETURN
20030
20040 Alpha:      !
20050   CSIZE 4
20060   MOVE 10,95
20070   LABEL "INSULATION RESISTANCE HISTOGRAM"
20080   !
20090   CSIZE 3
20100   MOVE 100,95
20110   LABEL Test_date$
20120   !
20130   CSIZE 3
20140   MOVE 10,90
20150   LABEL Sample$
20160   !
20170   CSIZE 3
20180   MOVE 15,3
20190   LABEL "INSULATION RESISTANCE, Megohm-uf X ";Mult
20200   !
20210   CSIZE 3
20220   MOVE 105,6
20230   IF Plots=0 THEN LABEL "MEAN    :";DROUND(Data(Sample_no+4,3),4)
20240   IF Plots=1 THEN LABEL "MEAN    :";DROUND(Data(Sample_no+4,4),4)
20250   IF Plots=2 THEN LABEL "MEAN    :";DROUND(Data(Sample_no+4,5),4)
20260   IF Plots=3 THEN LABEL "MEAN    :";DROUND(Data(Sample_no+4,6),4)
20270   MOVE 105,3
20280   LABEL "VOLTAGE:";Voltage
20290   !
20300   CSIZE 3
20310   MOVE 2,65
20320      Label$="OCCURENCES"
20330      FOR K=1 TO 10
20340      LABEL Label$[K,K]
20350      NEXT K
20360   RETURN
20370   !
20380 Outline:          !
20390   VIEWPORT 15,130,15,85           ! Define screen area
20400   FRAME
20410   WINDOW 0,100*Jig1,0,10*Jig2     ! Set window
20420   ! X tics
20430   AXES (100*Jig1)/20,0,0,0,2,2,5
20440   !    Xtics,Ytics,Xlocation,Ylocation,Xmajor count,Ymajor count,Size
20450   ! Y tics
20460   AXES 0,(10*Jig2)/20,0,0,10,2,4
20470   !    Xtics,Ytics,Xlocation,Ylocation,Xmajor count,Ymajor count,Size
20480   RETURN
20490 Label_x:                !
20500 VIEWPORT 0,130,0,100
20510        CSIZE 3
20520        LORG 5
20530        Y=-.5*Jig2
20540        MOVE (10*Jig1),Y
20550        Label=10*Jig1
20560        LABEL Label
```

```
20570            FOR K=2 TO 9
20580            MOVE (10*Jig1)*K,Y
20590            LABEL K*(10*Jig1)
20600            NEXT K
20610        RETURN
20620 !
20630 Label_y:                              !
20640 VIEWPORT 0,130,0,100
20650            CSIZE 3
20660            LORG 5
20670            X=-6*Jig1
20680            MOVE X,(1*Jig2)
20690            Label=1*Jig2
20700            LABEL Label
20710            FOR K=2 TO 9
20720            MOVE X,(1*Jig2)*K
20730            LABEL Label*K
20740            NEXT K
20750 RETURN
20760 !
20770 X_scale:        !
20780            IF Resist(Sample_no+2)>1000 THEN GOTO 20820
20790                Mult=100
20800                Jig1=.1
20810                RETURN
20820            IF Resist(Sample_no+2)>10000 THEN GOTO 20860
20830                Mult=1000
20840                Jig1=.1
20850                RETURN
20860            IF Resist(Sample_no+2)>50000 THEN GOTO 20900
20870                Mult=1000
20880                Jig1=.5
20890                RETURN
20900            IF Resist(Sample_no+2)>100000 THEN GOTO 20950
20910                Mult=1000
20920                Jig1=1
20930                RETURN
20940            !
20950                Mult=1000
20960                Jig1=INT(ABS(Resist(Sample_no+2))/100000)+1
20970            RETURN
20980 Bin:           !
20990                !
21000              Buckets=100
21010              B_size=((100*Mult)/Buckets)*Jig1
21020     !
21030            FOR K=1 TO Sample_no
21040            Q=INT(ABS(Resist(K)*Data(K,1))/B_size)+1   ! Bucket no of value
21050            B_no(Q)=B_no(Q)+1                         ! Number in bucket
21060            NEXT K
21070            !
21080            Max_no=0                                  ! Max in any bucket
21090            FOR K=1 TO Buckets
21100            IF B_no(K)>Max_no THEN Max_no=B_no(K)
21110            NEXT K
21120            !
21130            Jig2=1+INT(Max_no/10)                     ! Determine Y scale
21140            !
21150        RETURN
21160 Plot:     !
21170            VIEWPORT 0,130,0,100
21180    !
21190            X=0
21200            Y=0
21210                MOVE X,Y
```

```
21220              FOR K=1 TO Buckets
21230              DRAW X,B_no(K)
21240              X=X+B_size/Mult
21250              Y=Y+(B_no(K)*(B_size/Mult))
21260              DRAW X,B_no(K)
21270              NEXT K
21280       Plots=Plots+1
21290           RETURN
21300 Print:       !
21310           DUMP GRAPHICS
21320           GCLEAR
21330           RETURN
21340 End:      SUBEND
21350 !*******************************************
21360 SUB Check     !
21370 !*******************************************
21380 !
21390 COM /Bus/ @Meter,Xist_plot, Probes(1:4,1:2),Bus, Testnum(4), Viewnum(4),
      Meter_pa,Lcr,Prt,Plt,Multi
21400 !
21410 DISP                    ! Clear Display line
21420 OUTPUT 1 USING "@"      ! Clear CRT
21430 Bus_=716     ! Optional Bus address
21440 READ Testnum(*),Viewnum(*)   ! Sets up the order in which measurements are
      made & displayed
21450 DATA -1,-2,4,2,3,0,3,1,4,2
21460 PRINTER IS 1
21470 DISP "Checking the system components......"
21480    DIM Message$[50]      ! STRING CONTAINING USER MESSAGE
21490    INTEGER Address       ! HOLDS HPIB ADDRESS DURING BUS SCAN
21500    INTEGER Bstatus       ! HPIB STATUS REG CONTENTS
21510!
21520    Xist_4140=0
21530    Xist_lcr=0
21540    Xist_prt=0
21550    Xist_multi=0
21560!
21570!   INITIALIZE  DEVICE ADDRESSES
21580    Meter_pa=716          ! default
21590    Lcr=717
21600    Prt=701
21610    Multi=723
21620    Bus=7
21630!
21640 ! CHECK FOR EQUIPMENT ON BUS AT ALL ADDRESSES AND PRINT DEVICE NAMES
21650!
21660!   cancel any perverse LOCAL Bus
21670    IF BIT(Bstatus,7) THEN ! must be system
21680       REMOTE Bus          ! controller to
21690    END IF                 ! do this
21700                           !
21710    FOR Address=Bus*100 TO Bus*100+30
21720      OUTPUT Address USING "#"       !    ADDRESS DEVICE TO LISTEN, Bus TO
      TALK
21730      WAIT .1              ! slow handshake ok     !
21740      STATUS Bus,7;Bstatus ! DID IT LISTEN?
21750      SEND Bus;DATA        ! Unhang 37201A
21760      IF BIT(Bstatus,13) THEN
21770      ! DEVICE PRESENT (NDAC came True)
21780        Message$="Device Unknown"
21790        IF Address=Prt THEN GOSUB System_printer
21800        IF Address=Lcr THEN GOSUB Meter_lcr
21810        IF Address=Meter_pa THEN GOSUB Meter_pa
21820        IF Address=Multi THEN GOSUB Multi
21830      END IF
```

```
21840 Nxt:NEXT Address
21850 !
21860    STATUS Bus,3;Bstatus
21870    IF NOT Xist_prt THEN Prt=1 ! use 9826 CRT
21880 !
21890    Message$="    Pa METER NOT PRESENT OR NOT ADDRESSED"
21900    IF NOT Xist_4140 THEN Rsterminate
21910    OUTPUT 1 USING "/"
21920 !
21930    Message$="    PRINTER NOT PRESENT OR NOT ADDRESSED"
21940    IF NOT Xist_prt THEN Rsterminate
21950    OUTPUT 1 USING "/"
21960 !
21970    Message$="    LCR METER NOT PRESENT OR NOT ADDRESSED"
21980    IF NOT Xist_lcr THEN Rsterminate
21990    OUTPUT 1 USING "/"
22000 !
22010    Message$="    MULTIPROGRAMMER NOT PRESENT OR NOT ADDRESSED"
22020    IF NOT Xist_multi THEN Rsterminate
22030    OUTPUT 1 USING "/"
22040 !
22050    SUBEXIT ! all well.......
22060 !
22070 System_printer:   ON TIMEOUT Bus,3 GOTO Timeout82
22080    Xist_prt=1
22090    RETURN
22100 !
22110 Multi: ON TIMEOUT Bus,3 GOTO Timeout83
22120    Xist_multi=1
22130    RETURN
22140 !
22150 Meter_lcr:ON TIMEOUT Bus,3 GOTO Timeout81
22160    ASSIGN @Meter TO 717
22170    OUTPUT @Meter;"SR0"              ! Clear 4274A interrupt mask (srq)
22180    CLEAR 717
22190    OFF TIMEOUT Bus
22200    Xist_lcr=1
22210    RETURN
22220 !
22230 Meter_pa:ON TIMEOUT Bus,3 GOTO Timeout80
22240    ASSIGN @Meter TO Meter_pa
22250    OUTPUT @Meter;"SR0"              ! Clear 4140B interrupt mask (srq)
22260    CLEAR 716
22270    OFF TIMEOUT Bus
22280    Xist_4140=1
22290 !
22300    RETURN
22310 !
22320 Timeout83:         ! ERROR TRAPS
22330    Message$="    MULTIPROGRAMMER NOT ADDRESSED"
22340    GOTO Rsterminate
22350 !
22360 Timeout82:         ! ERROR TRAPS
22370    Message$="    PRINTER NOT ADDRESSED"
22380    GOTO Rsterminate
22390 !
22400 !
22410 Timeout81:         ! ERROR TRAPS
22420    Message$="    4274A NOT ADDRESSED"
22430    GOTO Rsterminate
22440    !
22450 Timeout80:         ! ERROR TRAPS
22460    Message$="    4140B NOT ADDRESSED"
22470    GOTO Rsterminate
22480 !
```

```
22490 Nodevices:!
22500   Message$="     NO DEVICES ON HP-IB SELECT CODE "&VAL$(Bus)
22510 !
22520 Rsterminate:        ! RESET INTERFACE
22530   CONTROL Bus,0;1
22540 Terminate:!
22550   OFF ERROR
22560   PRINT "PROGRAM TERMINATED."
22570   PRINT ""
22580   PRINT Message$
22590   DISP
22600   STOP!
22610!
22620 SUBEND !
22630!****************************************************************
22640 SUB File
22650 !****************************************************************
22660 COM /Condns/ Sample_no,Voltage_no, Voltage,Voltage1, Voltage2,Voltage3,
      Voltage4,Adapter1,Temp_cor,Time,Hz,Test_temp,Bottom1,Cap1,Df1
22670   COM /Data/ Data(103,6),Z,W
22680   COM /Info/ Job_no$[20], Sample$[80],Remarks$[80], Operator$[20],
      Type$[30],Test_date$[20],File$[10]
22690   !
22700   GCLEAR
22710   !
22720   ! File
22730        MASS STORAGE IS ":INTERNAL"
22740        CREATE BDAT File$,25,256
22750        ASSIGN @Path_1 TO File$
22760   OUTPUT @Path_1;Data(*)
22770   OUTPUT @Path_1;Voltage_no, Sample_no,Voltage1, Voltage2,Voltage3,
      Voltage4,Test_temp,Temp_cor,Time,Hz,Cap1,Df1
22780   OUTPUT @Path_1;Job_no$,Sample$,Remarks$,Operator$,Test_date$
22790        ASSIGN @Path_1 TO *
22800   !
22810   SUBEND !
22820 !****************************************************************
22830   SUB File_option
22840 !****************************************************************
22850 COM /Info/ Job_no$[20], Sample$[80],Remarks$[80], Operator$[20],
      Type$[30],Test_date$[20],File$[10]
22860   !
22870   DISP "Is a Disc File Required ?"
22880        ON KEY 5 LABEL "   YES" GOTO 22930
22890        ON KEY 9 LABEL "    NO" GOTO 23000
22900       X=0
22910       IF X=0 THEN GOTO 22910
22920       !
22930       File$="1"
22940       GOSUB Clear_menu
22950       DISP "Insert initialized disc and press 'CONTINUE'"
22960       PAUSE
22970       DISP
22980       SUBEXIT
22990       !
23000       File$="0"
23010       GOSUB Clear_menu
23020       SUBEXIT
23030       !
23040 Clear_menu:  !
23050              OUTPUT 1 USING "@"
23060              DISP
23070              CONTROL 1,12;0
23080              FOR I=0 TO 19
23090              ON KEY I LABEL "          " GOSUB Beep
```

```
23100            NEXT I
23110            RETURN
23120            !
23130 Beep:      !
23140            BEEP
23150            RETURN
23160            !
23170    SUBEND !
```

What is claimed:

1. Apparatus for automatically measuring various parameters of each of a plurality of capacitors comprising:
   a predetermined number of test fixtures, each test fixture being adapted to receive one of the capacitors to be tested;
   a plurality of measurement devices each operable to measure at least one predetermined parameter of a capacitor, one of the measurement devices being operative to measure the capacitance and the dissipation factor of the capacitor and a different one of the measurement devices being operative to measure the insulation resistance of the capacitor by measuring the leakage current of the capacitor at a predetermined applied DC electrical potential;
   a relay matrix connected between the test fixtures and the plurality of measurement devices;
   means for energizing predetermined combinations of relays in the relay matrix in accordance with a predetermined sequence thereby to connect predetermined ones of the test fixtures with predetermined ones of the measurement devices; and
   control means for asserting the particular one of the measurement devices connected to the particular test fixture via the energized relays in the relay matrix to measure the predetermined parameter of the capacitor.

2. The apparatus of claim 1 wherein one of the measurement devices is operative to measure the capacitance of the capacitor.

3. The apparatus of claim 2 wherein a different one of the measurement devices is operative to measure the dissipation factor of the capacitor.

4. The apparatus of claim 3 wherein a different one of the measurement devices is operative to measure the insulation resistance of the capacitor by measuring the leakage current of the capacitor at a predetermined applied electrical potential.

5. The apparatus of claim 4 further comprising a separate source of high voltage electrical potential operative in response to the control means and in conjunction with the device for measuring the insulation resistance of the capacitor.

6. The apparatus of claim 4 wherein the device for measuring the insulation resistance of the capacitor includes an internal source of electrical potential.

7. The apparatus of claim 1 wherein one of the measurement devices is operative to measure the dissipation factor of the capacitor.

8. The apparatus of claim 3 wherein a different one of the measurement devices is operative to measure the insulation resistance of the capacitor by measuring the leakage current of the capacitor at a predetermined applied electrical potential.

9. The apparatus of claim 8 further comprising a separate source of high voltage electrical potential operative in response to the control means and in conjunction with the device for measuring the insulation resistance of the capacitor.

10. The apparatus of claim 8 wherein the device for measuring the insulation resistance of the capacitor includes an internal source of electrical potential.

11. The apparatus of claim 1 wherein one of the measurement devices is operative to measure the insulation resistance of the capacitor by measuring the leakage current of the capacitor at a predetermined applied electrical potential.

12. The apparatus of claim 11 further comprising a separate source of high voltage electrical potential operative in response to the control means and in conjunction with the device for measuring the insulation resistance of the capacitor.

13. The apparatus of claim 11 wherein the device for measuring the insulation resistance of the capacitor includes an internal source of electrical potential.

14. The apparatus of claim 1 further comprising:
    means for generating a signal representative of the temperature of the capacitor connected to the measurement device.

15. The apparatus of claim 14 further comprising:
    means for recording the signal representative of the temperature of the capacitor connected to the measurement device.

16. The apparatus of claim 1 wherein each relay in the relay matrix comprises a high insulation resistance flying lead relay.

17. The apparatus of claim 1 wherein the measurement devices and the relays in the relay matrix are connected by coaxial cables, each cable having a first and a second end and having a shield, the shields of the cables being connected to a common potential at the first end of each shield.

18. The apparatus of claim 1 further comprising:
    a metal housing, each of the test fixtures being mounted in the housing,
    a door on the housing,
    a door actuated switch connected between the high voltage source and ground potential, the switch being responsive to the opening of the door to prevent an electrical shock hazard to an operator.

19. The apparatus of claim 1 having a chassis ground, each test fixture having a first terminal and a second terminal respectively connectible to a high voltage rail and a low voltage rail, the apparatus further comprising:
    capacitor discharge means connected across all of the test fixtures, for discharging a capacitor previously connected to a source of voltage, by the energization of a relay, wherein the discharge means comprises a first high resistance, high wattage resistor connected between the first terminal of the test fixture and chassis ground and a second high resistance, high wattage resistor connected between the second terminal of the test fixture and chassis ground.

20. The apparatus of claim 1 further comprising:
   means for recording the measured parameters of each of a plurality of capacitors.

* * * * *